US012727081B2

(12) United States Patent
Song et al.

(10) Patent No.: US 12,727,081 B2
(45) Date of Patent: Sep. 1, 2026

(54) FLEXIBLE CONNECTION MEMBER AND ELECTRONIC DEVICE INCLUDING THE SAME

(71) Applicant: Samsung Electronics Co., Ltd., Suwon-si (KR)

(72) Inventors: Sigyung Song, Suwon-si (KR); Jungje Bae, Suwon-si (KR); Jinseock Lee, Suwon-si (KR); Hyunje Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 18/799,428

(22) Filed: Aug. 9, 2024

(65) Prior Publication Data

US 2025/0081342 A1 Mar. 6, 2025

Related U.S. Application Data

(63) Continuation of application No. PCT/KR2024/011605, filed on Aug. 6, 2024.

(30) Foreign Application Priority Data

Aug. 28, 2023 (KR) ........................ 10-2023-0112797
Sep. 7, 2023 (KR) ........................ 10-2023-0119236

(51) Int. Cl.

| | |
|---|---|
| ***H05K 7/14*** | (2006.01) |
| ***H05K 1/11*** | (2006.01) |
| ***H05K 1/18*** | (2006.01) |

(52) U.S. Cl.
CPC ................. *H05K 1/11* (2013.01); *H05K 1/18* (2013.01); *H05K 7/1427* (2013.01); *H05K 2201/10356* (2013.01)

(58) Field of Classification Search
CPC .......... H05K 1/11; H05K 1/18; H05K 7/1427; H05K 2201/10356
(Continued)

(56) References Cited

U.S. PATENT DOCUMENTS 10,091,879 B2 10/2018 Ohtsu
2007/0095557 A1 5/2007 Wang
(Continued)

FOREIGN PATENT DOCUMENTS

CN 1963958 A 5/2007
CN 201213164 Y 3/2009
(Continued)

OTHER PUBLICATIONS

International Search Report dated Nov. 6, 2024, issued in International Application No. PCT/KR2024/011605.

*Primary Examiner* — Hung S. Bui
(74) *Attorney, Agent, or Firm* — Jefferson IP Law, LLP

(57) ABSTRACT

An electronic device is provided. The electronic device includes a housing, a circuit board, at least one electrical component disposed inside the housing, and a flexible connection member electrically connected to the circuit board and the at least one electrical component, wherein the flexible connection member includes an insulation layer, a signal line disposed on the insulation layer, a first ground line disposed on the insulation layer, a second ground line disposed on the insulation layer and spaced apart from the first ground line, a ground sheet disposed on the insulation layer, a first connection line electrically connected to the first ground line and the ground sheet and at least partially extending along a first direction, and a second connection line electrically connected to the second ground line and the ground sheet, at least partially extending along a second direction different from the first direction and crossing the first connection line, and wherein at least a portion of the
(Continued)

second connection line contacts at least a portion of the first connection line.

18 Claims, 13 Drawing Sheets

(58) Field of Classification Search
USPC ................................ 361/728, 752, 796, 800
See application file for complete search history.

(56) References Cited

U.S. PATENT DOCUMENTS

| | | | |
|---|---|---|---|
| 2010/0126754 A1 | 5/2010 | Koga | |
| 2017/0048363 A1 | 2/2017 | Lee et al. | |
| 2018/0053981 A1 | 2/2018 | Bae et al. | |
| 2019/0008033 A1 | 1/2019 | Chung et al. | |
| 2020/0137890 A1 | 4/2020 | Lee et al. | |
| 2021/0329784 A1 | 10/2021 | Park et al. | |
| 2021/0383948 A1 | 12/2021 | Yokokura | |
| 2023/0100675 A1* | 3/2023 | Gu | G06F 1/1641 361/679.27 |

FOREIGN PATENT DOCUMENTS

| | | | | |
|---|---|---|---|---|
| CN | 202512924 U | 10/2012 | | |
| CN | 212303122 U | 1/2021 | | |
| EP | 1 727 161 A1 | 5/2005 | | |
| JP | 2008-305633 A | 12/2008 | | |
| JP | 4333659 B2 | 9/2009 | | |
| JP | 6645364 B2 | 2/2020 | | |
| JP | 7040265 B2 | 3/2022 | | |
| KR | 10-2009-0119595 A | 11/2009 | | |
| KR | 10-2019-0004408 A | 1/2019 | | |
| KR | 10-2020-0019534 A | 2/2020 | | |
| KR | 10-2020-0048205 A | 5/2020 | | |
| KR | 10-2021-0118040 A | 9/2021 | | |
| KR | 10-2022-0133032 A | 10/2022 | | |
| TW | M430030 * | 5/2012 | H01R 12/77 | |

* cited by examiner

FLEXIBLE CONNECTION MEMBER AND ELECTRONIC DEVICE INCLUDING THE SAME

CROSS-REFERENCE TO RELATED APPLICATION(S)

This application is a continuation application, claiming priority under § 365(c), of an International application No. PCT/KR2024/011605, filed on Aug. 6, 2024, which is based on and claims the benefit of a Korean patent application number 10-2023-0112797, filed on Aug. 28, 2023, in the Korean Intellectual Property Office, and of a Korean patent application number 10-2023-0119236, filed on Sep. 7, 2023, in the Korean Intellectual Property Office, the disclosure of each of which is incorporated by reference herein in its entirety.

TECHNICAL FIELD

The disclosure relates to an electronic device, e.g., a flexible connection member and an electronic device including the same.

BACKGROUND ART

Advancing information communication and semiconductor technologies accelerate the spread and use of various electronic devices. Electronic devices are being developed to carry out communication while carried on.

The term "electronic device" may mean a device performing a particular function according to its equipped program, such as a home appliance, an electronic scheduler, a portable multimedia player, a mobile communication terminal, a tablet personal computer (PC), a video/sound device, a desktop PC or laptop computer, a navigation for automobile, or the like. For example, the electronic devices may output stored information as voices or images. As electronic devices are highly integrated, and high-speed, high-volume wireless communication becomes commonplace, an electronic device, such as a mobile communication terminal, is being equipped with various functions. For example, an electronic device comes with the integrated functionality, including an entertainment function, such as playing video games, a multimedia function, such as replaying music/videos, a communication and security function, such as for mobile banking, and a scheduling or e-wallet function. These electronic devices have been downsized to be conveniently carried by users.

The above information is presented as background information only to assist with an understanding of the disclosure. No determination has been made, and no assertion is made, as to whether any of the above might be applicable as prior art with regard to the disclosure.

DISCLOSURE OF INVENTION

Solution to Problems

Aspects of the disclosure are to address at least the above-mentioned problems and/or disadvantages and to provide at least the advantages described below. Accordingly, an aspect of the disclosure is to provide an electronic device, e.g., a flexible connection member and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a housing, a circuit board disposed inside the housing, at least one electrical component disposed inside the housing, and a flexible connection member electrically connected to the circuit board and the at least one electrical component, wherein the flexible connection member includes an insulation layer, a signal line disposed on the insulation layer, a first ground line disposed on the insulation layer, a second ground line disposed on the insulation layer and spaced apart from the first ground line, a ground sheet disposed on the insulation layer, a first connection line electrically connected to the first ground line and the ground sheet and at least partially extending along a first direction, a second connection line electrically connected to the second ground line and the ground sheet, at least partially extending along a second direction different from the first direction and crossing the first connection line, and wherein at least a portion of the second connection line contacts at least a portion of the first connection line.

In accordance with another aspect of the disclosure, a flexible connection member is provided. The flexible connection member includes an insulation layer, a signal line disposed on the insulation layer, a first ground line disposed on the insulation layer, a second ground line disposed on the insulation layer and spaced apart from the first ground line, a ground sheet disposed on the insulation layer, a first connection line electrically connected to the first ground line and the ground sheet and at least partially extending along a first direction, a second connection line electrically connected to the second ground line and the ground sheet, at least partially extending along a second direction different from the first direction, and crossing the first connection line, wherein at least a portion of the second connection line contacts at least a portion of the first connection line.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include computer-executable instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth™ chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an IC, or the like.

Figure 1:
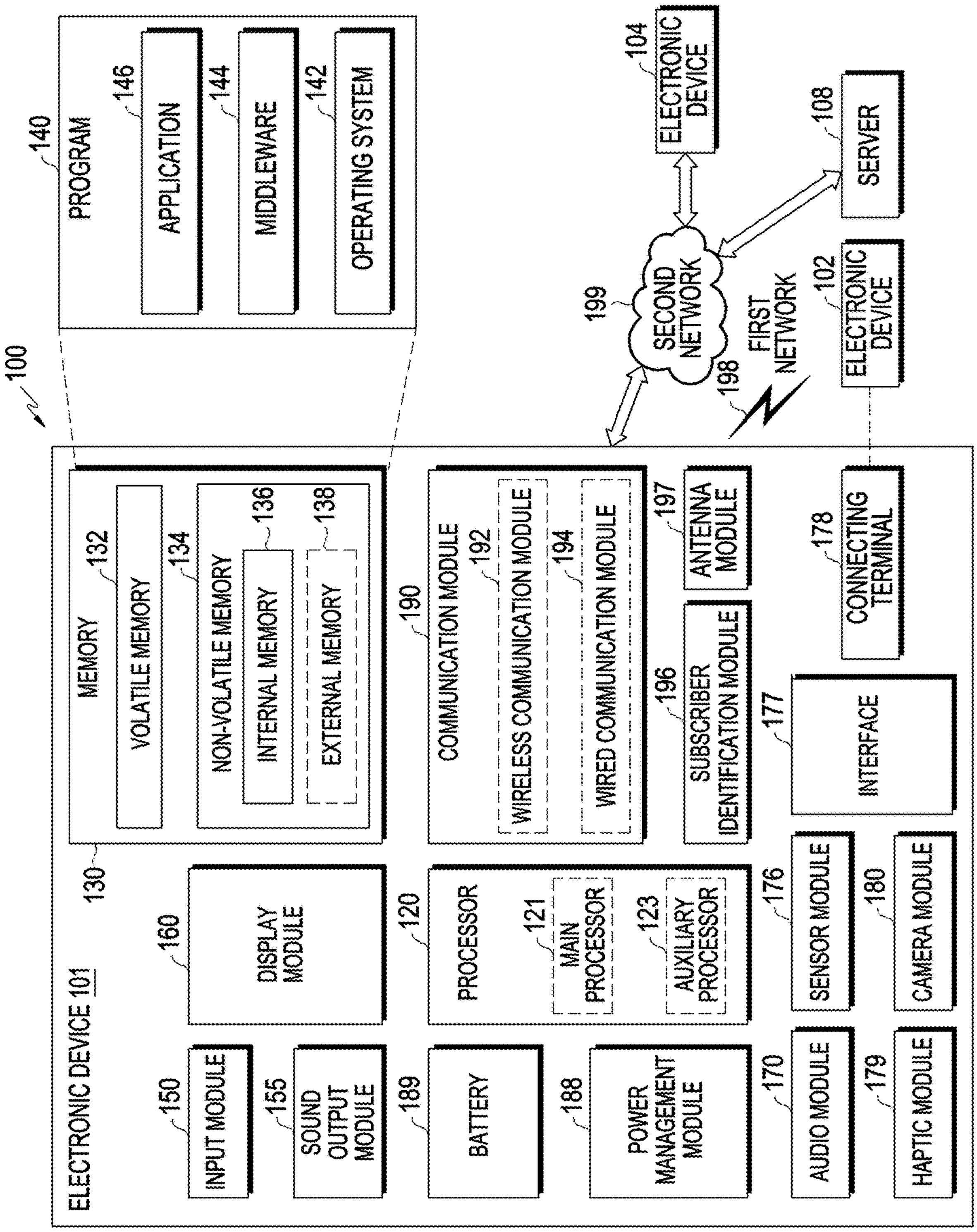
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with at least one of an external electronic device 102 via a first network 198 (e.g., a short-range wireless communication network), or an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment of the disclosure, at least one (e.g., the connecting terminal 178) of the components may be omitted from the electronic device 101, or one or more other components may be added in the electronic device 101. According to an embodiment of the disclosure, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment of the disclosure, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor configured to detect a touch, or a pressure sensor configured to measure the intensity of a force generated by the touch.

The audio module 170 may convert a sound into an electrical signal and vice versa. According to an embodiment of the disclosure, the audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to an embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a fifth generation (5G) network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment of the disclosure, the antenna module 197 may include one antenna including a radiator formed of a conductor or conductive pattern formed on a substrate (e.g., a printed circuit board (PCB)). According to an embodiment of the disclosure, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment of the disclosure, other parts (e.g., radio frequency integrated circuit (RFIC)) than the radiator may be further formed as part of the antenna module 197.

According to various embodiments of the disclosure, the antenna module 197 may form a mmWave antenna module. According to an embodiment of the disclosure, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment of the disclosure, all or some of operations to be executed at the electronic device 101 may be executed at one or more of the external electronic devices 102 and 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment of the disclosure, the external electronic device 104 may include an Internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or health-care) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The storage medium readable by the machine may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. Some of the plurality of entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

Figure 2:
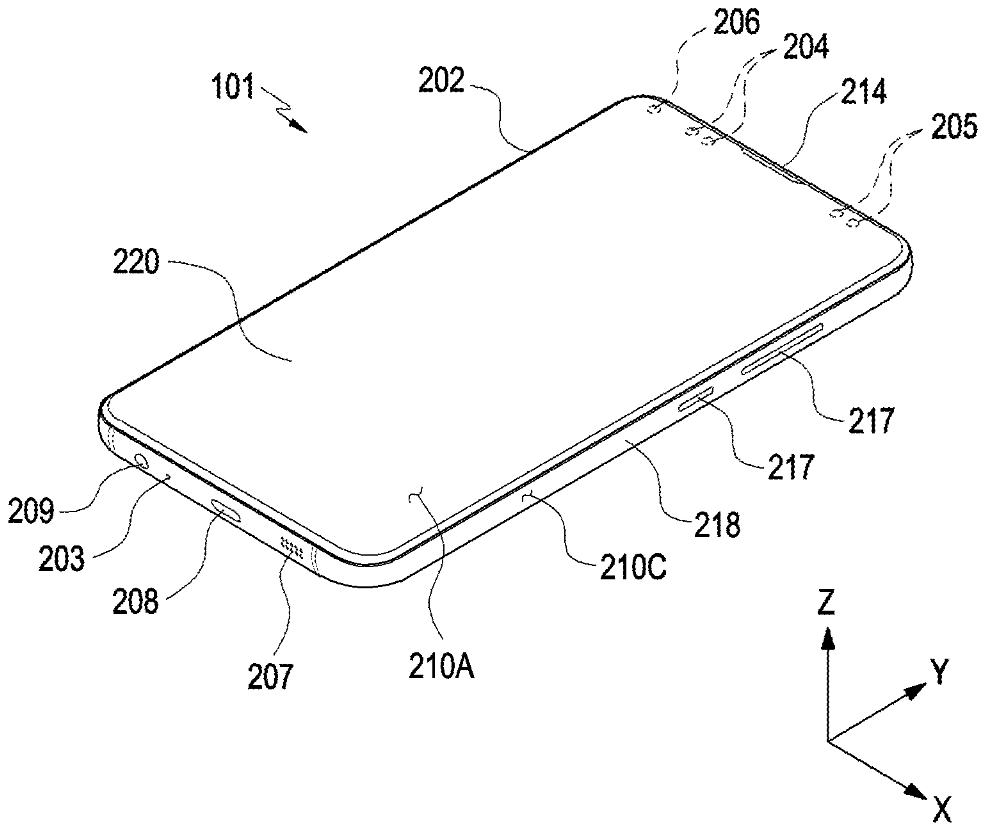
FIG. 2 is a front perspective view illustrating an electronic device according to an embodiment of the disclosure.

FIG. 2 is a front perspective view illustrating an electronic device according to an embodiment of the disclosure.

Figure 3:
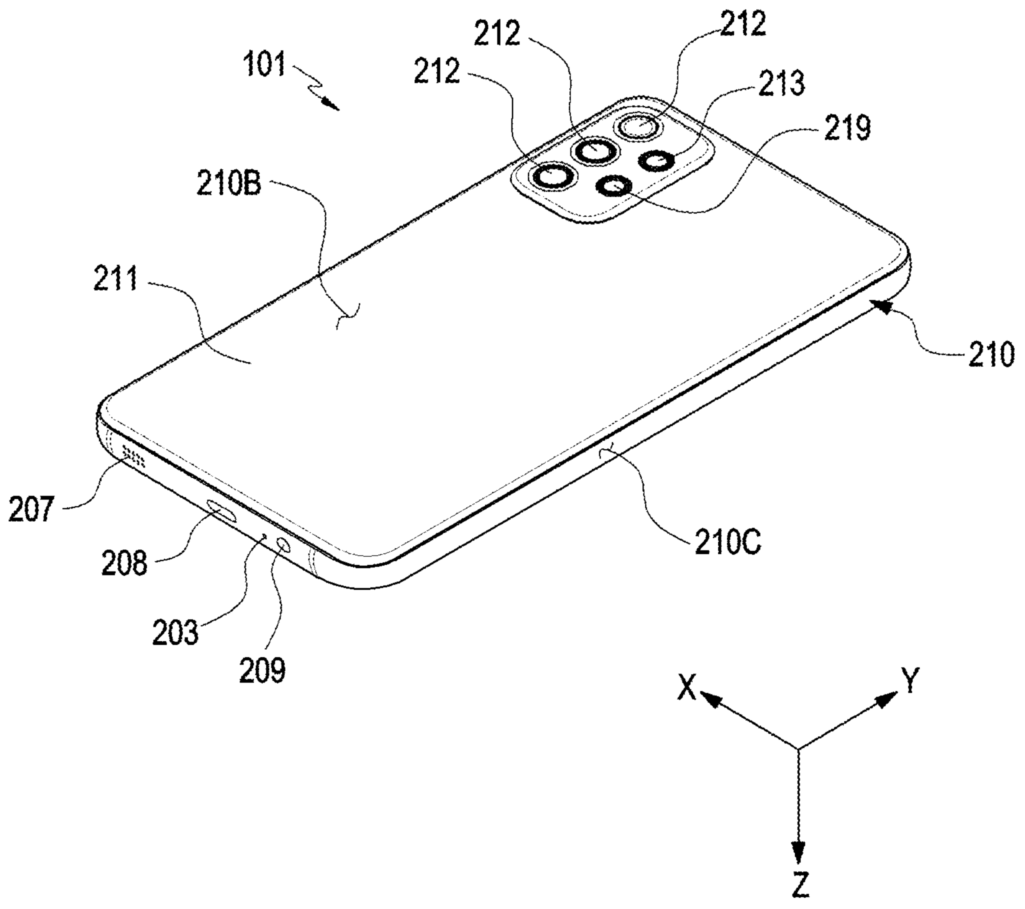
FIG. 3 is a rear perspective view illustrating an electronic device according to an embodiment of the disclosure.

FIG. 3 is a rear perspective view illustrating an electronic device according to an embodiment of the disclosure.

Hereinafter, for convenience of description of FIGS. 2 to 10, 11A, 11B, and 12, FIGS. FIGS. 2 to 10, 11A, 11B, and 12 illustrate a Cartesian coordinate system defined and interpreted with the X, Y and Z axes orthogonal to each other. Hereinafter, for convenience of description, the X-axis direction may be defined and interpreted as the width direction of the electronic device or components of the electronic device, the Y-axis direction may be defined and interpreted as the length direction of the electronic device or components of the electronic device, and the Z-axis direction may be defined and interpreted as the height direction (or thickness direction) of the electronic device or components of the electronic device.

The embodiments of FIGS. 2 and 3 may be combined with the embodiment of FIG. 1 or the embodiments of FIGS. 4 to 10, 11A, 11B, and 12.

Referring to FIGS. 2 and 3, according to an embodiment of the disclosure, an electronic device 101 (e.g., the electronic device 101 of FIG. 1) may include a housing 210 including a first surface (or front surface) 210A, a second surface (or rear surface) 210B, and a side surface 210C surrounding a space between the first surface 210A and the second surface 210B. In an embodiment of the disclosure, the housing 210 may denote a structure forming the first surface 210A of FIG. 2, the second surface 210B of FIG. 3, and some of the side surfaces 210C. According to an embodiment of the disclosure, at least part of the first surface 210A may have a substantially transparent front plate 202 (e.g., a glass plate or polymer plate including various coat layers). The second surface 210B may be formed by a rear plate 211 that is substantially opaque. The rear plate 211 may be formed of, e.g., laminated or colored glass, ceramic, polymer, metal (e.g., aluminum, stainless steel (STS), or magnesium), or a combination of at least two thereof. The side surface 210C may be formed by a side structure (or "side bezel structure") 218 that couples to the front plate 202 and the rear plate 211 and includes a metal and/or polymer. In an embodiment of the disclosure, the rear plate 211 and the side structure 218 may be integrally formed together and include the same material (e.g., a metal, such as aluminum).

Although not shown, the front plate 202 may include area(s) that bend from at least a portion of an edge toward the rear plate 211 and seamlessly extend. In an embodiment of the disclosure, only one of the areas of the front plate 202 (or the rear plate 211), which bend to the rear plate 211 (or front plate 202) and extend may be included in one edge of the first surface 210A. According to an embodiment of the disclosure, the front plate 202 or the rear plate 211 may have a substantially flat plate shape. For example, no bent and extended area may be included. When an area bending and extending is included, the thickness of the electronic device 101 at the portion including the area bending and extending may be smaller than the thickness of the rest.

According to an embodiment of the disclosure, the electronic device 101 may include at least one or more of a display 220, audio modules 203, 207, and 214, sensor modules 204 and 219, camera modules 205, 212, and 213, key input devices 217, a light emitting device 206, and connector holes 208 and 209. In an embodiment of the disclosure, the electronic device 101 may exclude at least one (e.g., the key input device 217 or the light emitting device 206) of the components or may add other components.

The display 220 may be visually exposed through a significant portion of the front plate 202. In an embodiment of the disclosure, at least a portion of the display 220 may be visually exposed through the front plate 202 forming the first surface 210A, or through a portion of the side surface 210C. In an embodiment of the disclosure, the edge of the display 220 may be formed to be substantially the same in shape as an adjacent outer edge of the front plate 202. In an embodiment (not illustrated), the interval between the outer edge of the display 220 and the outer edge of the front plate 202 may remain substantially even to give a larger area of visual exposure of the display 220.

In an embodiment of the disclosure, the screen display region of the display 220 may have a recess or opening in a portion thereof, and at least one or more of the audio module 214, sensor module 204, camera module 205, and light emitting device 206 may be aligned with the recess or opening. In an embodiment of the disclosure, at least one or more of the audio module 214, sensor module 204, camera module 205, fingerprint sensor, and light emitting device 206 may be included on the rear surface of the screen display region of the display 220. In an embodiment of the disclosure, the display 220 may be disposed to be coupled with, or adjacent, a touch detecting circuit, a pressure sensor capable of measuring the strength (pressure) of touches, and/or a digitizer for detecting a magnetic field-type stylus pen.

The audio modules 203, 207, and 214 may include a microphone hole 203 and speaker holes 207 and 214. A microphone for acquiring external sounds may be disposed in the microphone hole 203. In an embodiment of the disclosure, a plurality of microphones may be disposed to detect the direction of the sound. The speaker holes 207 and 214 may include an external speaker hole 207 and a phone receiver hole 214. In an embodiment of the disclosure, the speaker holes 207 and 214 and the microphone hole 203 may be implemented as a single hole, or speakers may be rested without the speaker holes 207 and 214 (e.g., piezo speakers).

The sensor modules 204 and 219 may generate an electrical signal or data value corresponding to an internal operating state or external environmental state of the electronic device 101. For example, the sensor modules 204 and 219 may include a first sensor module 204 (e.g., a proximity sensor) and/or a second sensor module (e.g., a fingerprint sensor), which is disposed on the first surface 210A of the housing 210, and/or a third sensor module 219 and/or a fourth sensor module (e.g., a fingerprint sensor) disposed on the second surface 210B of the housing 210. The fingerprint sensor may be disposed on the second surface 210B or side surface 210C as well as the first surface 210A (e.g., the display 220) of the housing 210. The electronic device 101 may further include, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212, and 213 may include a first camera device 205 disposed on the first surface 210A of the electronic device 101, and a second camera device 212 and/or a flash 213 disposed on the second surface 210B. The camera modules 205 and 212 may include one or more lenses, an image sensor, and/or an image signal processor. The flash 213 may include, e.g., a light emitting diode (LED) or a xenon lamp. In an embodiment of the disclosure, two or more lenses (an infrared (IR) camera, a wide-angle lens, and a telescopic lens) and image sensors may be disposed on one surface of the electronic device 101. In an embodiment of the disclosure, flash 213 may emit infrared light. The infrared light emitted by the flash 213 and reflected by the subject may be received through the third sensor module 219. The electronic device 101 or the processor of the electronic device 101 may detect depth information about the subject based on the time point when the infrared light is received from the third sensor module 219.

The key input device 217 may be disposed on the side surface 210C of the housing 210. In an embodiment of the disclosure, the electronic device 101 may exclude all or some of the above-mentioned key input devices 217 and the excluded key input devices 217 may be implemented in other forms, e.g., as soft keys, on the display 220. In an embodiment of the disclosure, the key input device 217 may include the sensor module disposed on the second surface 210B of the housing 210.

The light emitting device 206 may be disposed on, e.g., the first surface 210A of the housing 210. The light emitting device 206 may provide, e.g., information about the state of the electronic device 101 in the form of light. In an embodiment of the disclosure, the light emitting device 206 may provide a light source that interacts with, e.g., the camera module 205. The light emitting device 206 may include, e.g., a light emitting diode (LED), an infrared (IR) LED, or a xenon lamp.

The connector holes 208 and 209 may include a first connector hole 208 for receiving a connector (e.g., a universal serial bus (USB) connector) for transmitting or receiving power and/or data to/from an external electronic device and/or a second connector hole 209 (e.g., an earphone jack) for receiving a connector for transmitting or receiving audio signals to/from the external electronic device.

Figure 4:
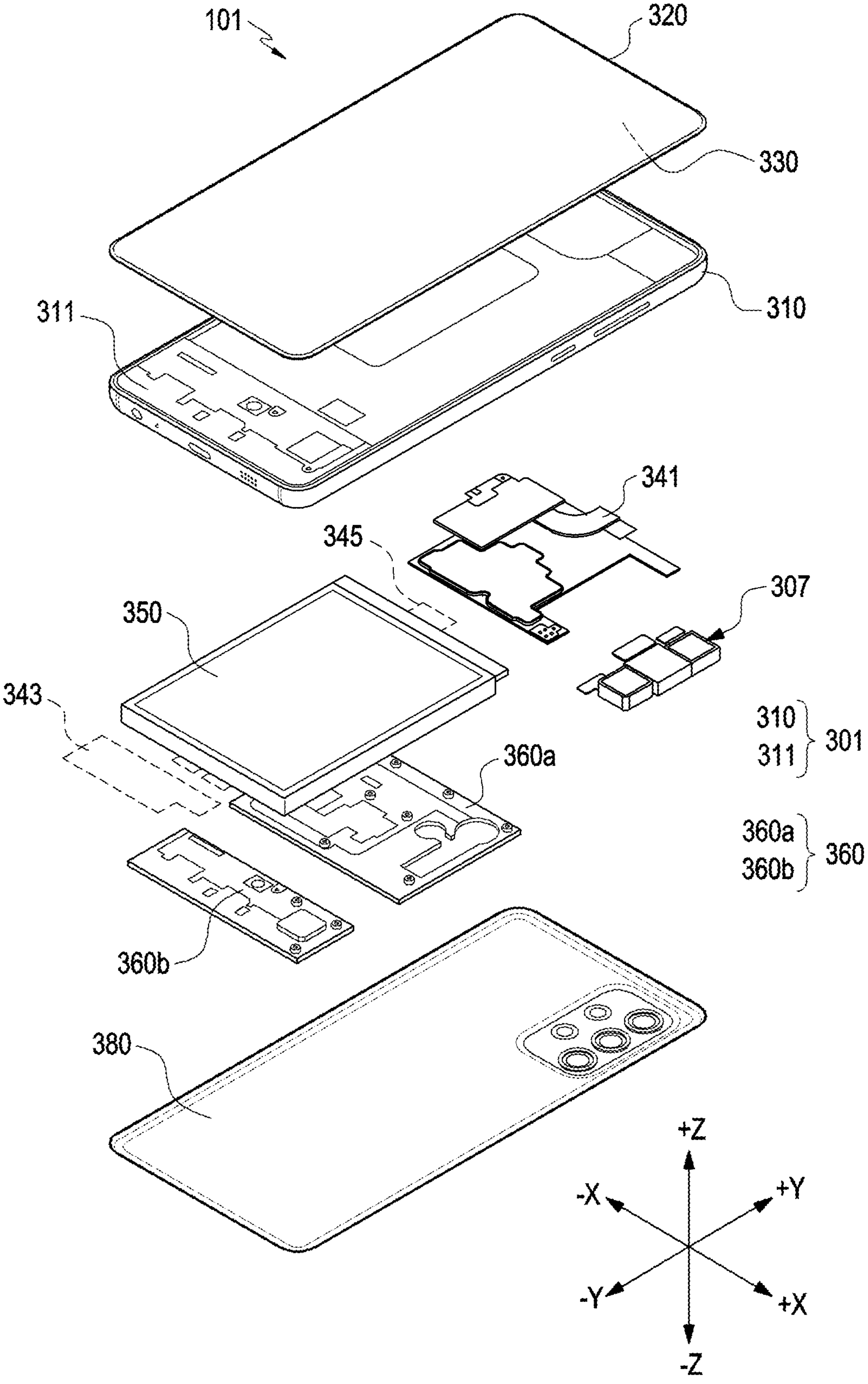
FIG. 4 is a front exploded perspective view illustrating an electronic device according to an embodiment of the disclosure.

FIG. 4 is a front exploded perspective view illustrating an electronic device according to an embodiment of the disclosure.

Figure 5:
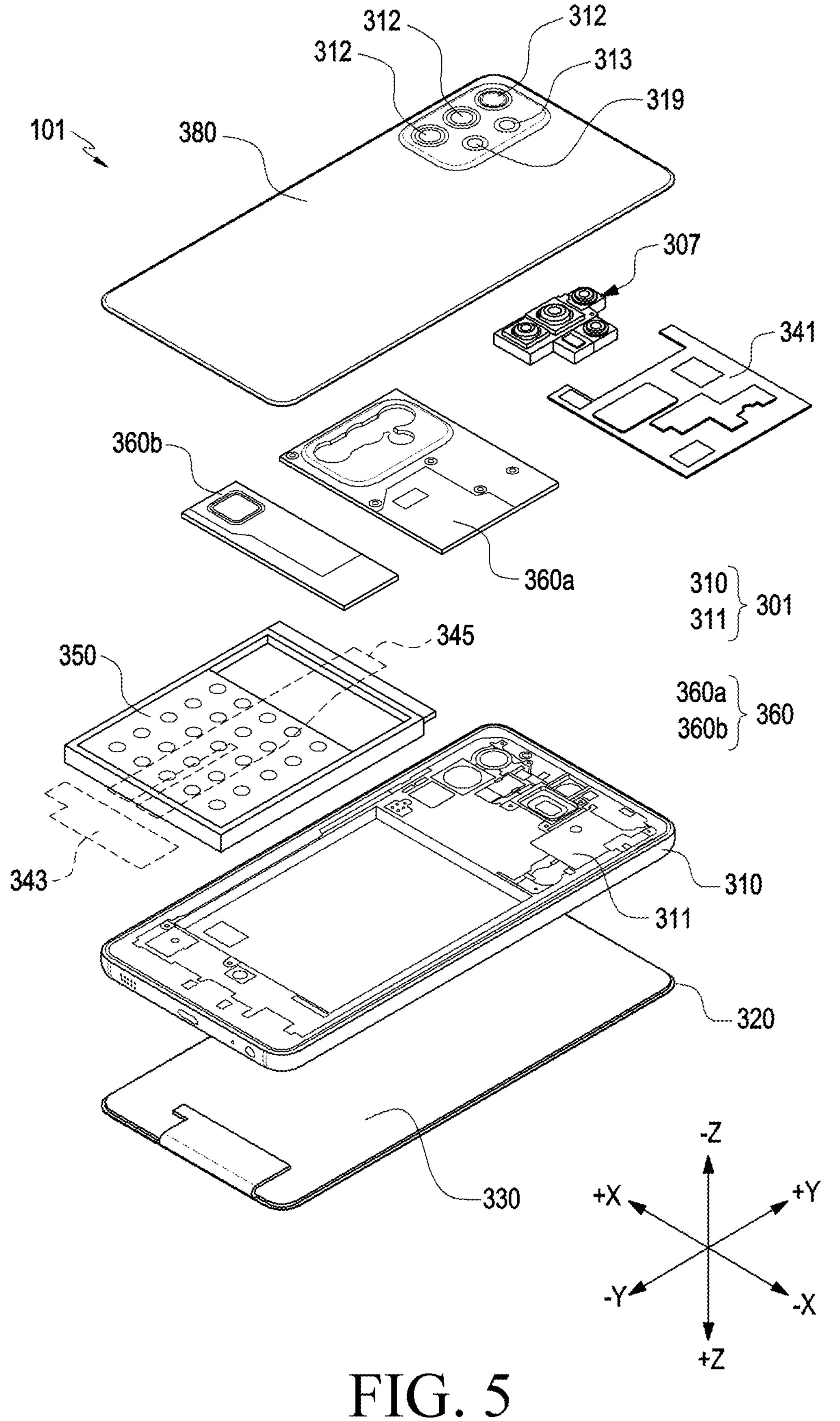
FIG. 5 is a rear exploded perspective view illustrating an electronic device according to an embodiment of the disclosure.

FIG. 5 is a rear exploded perspective view illustrating an electronic device according to an embodiment of the disclosure.

The embodiments of FIGS. 4 and 5 may be combined with the embodiments of FIGS. 1 to 3 or the embodiments of FIGS. 6 to 10, 11A, 11B, and 12.

Referring to FIGS. 4 and 5, an electronic device 101 (e.g., the electronic device 101 of FIG. 1 or the electronic device 101 of FIGS. 2 and 3) may include a side structure 310, a first supporting member 311 (e.g., a bracket), a front plate 320 (e.g., the front plate 202 of FIG. 1), a display 330 (e.g., the display 220 of FIG. 1), at least one printed circuit board (or a board assembly) 341 or 343, a battery 350, a second supporting member 360 (e.g., a rear case), an antenna, a camera assembly 307, and a rear plate 380 (e.g., the rear plate 211 of FIG. 2). When including a plurality of printed circuit boards 341 and 343, the electronic device 101 may electrically connect the different printed circuit boards by including at least one flexible connection member 345. For example, the printed circuit boards 341 and 343 may include a first circuit board 341 disposed above the battery 350 (e.g., in the +Y-axis direction) and a second circuit board 343 disposed under the battery 350 (e.g., in the −Y-axis direction), and the flexible connection member 345 may electrically connect the first circuit board 341 and the second circuit board 343.

According to an embodiment of the disclosure, the electronic device 101 may exclude at least one (e.g., the first supporting member 311 or the second supporting member 360) of the components or may add other components. At least one of the components of the electronic device 101 may be the same or similar to at least one of the components of the electronic device 101 of FIG. 1 to 3 and no duplicate description is made below.

According to an embodiment of the disclosure, at least a portion of the first supporting member 311 may be provided in a flat plate shape. In an embodiment of the disclosure, the first supporting member 311 may be disposed inside the electronic device 101 to be connected with the side structure 310 or integrated with the side structure 310. The first supporting member 311 may be formed of, e.g., a metallic material and/or non-metallic material (e.g., polymer). When the first supporting member 311 is at least partially formed of a metallic material, a portion of the side structure 310 or the first supporting member 311 may function as an antenna. The display 330 may be joined onto one surface of the first supporting member 311, and the printed circuit boards 341 and 343 may be joined onto the opposite surface of the first supporting member 311. A processor, the memory, and/or interface may be mounted on the printed circuit boards 341 and 343. The processor may include one or more of, e.g., a central processing unit, an application processor, a graphic processing device, an image signal processing, a sensor hub processor, or a communication processor.

According to an embodiment of the disclosure, the first supporting member 311 and the side structure 310 may be collectively referred to as a front case or a housing 301. According to an embodiment of the disclosure, the housing 301 may be generally understood as a structure for receiving, protecting, or disposing the printed circuit boards 341 and 343 or the battery 350. In an embodiment of the disclosure, the housing 301 may be understood as including a structure that the user may visually or tactfully recognize from the exterior of the electronic device 101, e.g., the side structure 310, the front plate 320, and/or the rear plate 380. In an embodiment of the disclosure, the 'front or rear surface of the housing 301' may refer to the first surface 210A of FIG. 2 or the second surface 210B of FIG. 3. In an embodiment of the disclosure, the first supporting member 311 may be disposed between the front plate 320 (e.g., the first surface 210A of FIG. 2) and the rear plate 380 (e.g., the second surface 210B of FIG. 3) and may function as a structure for placing an electrical/electronic component, such as the printed circuit boards 341 and 343 or the camera assembly 307.

According to an embodiment of the disclosure, the memory may include, e.g., volatile or non-volatile memory.

According to an embodiment of the disclosure, the interface may include, e.g., a high definition multimedia interface (HDMI), a universal serial bus (USB) interface, a secure digital (SD) card interface, and/or an audio interface. The interface may electrically or physically connect, e.g., the electronic device 101 with an external electronic device and may include a USB connector, an SD card/multimedia card (MMC) connector, or an audio connector.

According to an embodiment of the disclosure, the second supporting member 360 may include, e.g., an upper supporting member 360*a* and a lower supporting member 360*b*. In an embodiment of the disclosure, the upper supporting member 360*a*, together with a portion of the first supporting member 311, may be disposed to surround the printed circuit boards 341 and 343 (e.g., the first circuit board 341). For example, the upper supporting member 360*a* of the second supporting member 360 may be disposed to face the first supporting member 311 with the first circuit board 341 interposed therebetween. In an embodiment of the disclosure, the lower supporting member 360*b* of the second supporting member 360 may be disposed to face the first supporting member 311 with the second circuit board 343 interposed therebetween. A circuit device (e.g., a processor, a communication module, or memory) implemented in the form of an integrated circuit chip or various electrical/electronic components may be disposed on the printed circuit boards 341 and 343. According to an embodiment of the disclosure, the printed circuit boards 341 and 343 may receive an electromagnetic shielding environment from the second supporting member 360. In an embodiment of the disclosure, the lower supporting member 360*b* may be utilized as a structure in which electrical/electronic components, such as a speaker module and an interface (e.g., a USB connector, an SD card/MMC connector, or an audio connector) may be disposed. In an embodiment of the disclosure, electrical/electronic components, such as a speaker module and an interface (e.g., a USB connector, an SD card/MMC connector, or an audio connector) may be disposed on an additional printed circuit board (not shown). For example, the lower supporting member 360*b*, together with the other part of the first supporting member 311, may be disposed to surround the additional printed circuit board. The speaker module or interface disposed on the additional printed circuit board (not shown) or the lower supporting member 360*b* may be disposed corresponding to the audio module 207 or connector holes 208 and 209 of FIG. 2.

According to an embodiment of the disclosure, the battery 350 may be a device for supplying power to at least one component of the electronic device 101. The battery 189 may include, e.g., a primary cell which is not rechargeable, a secondary cell which is rechargeable, or a fuel cell. At least a portion of the battery 350 may be disposed on substantially the same plane as the printed circuit boards 341 and 343. The battery 350 may be integrally or detachably disposed inside the electronic device 101.

Although not shown, the antenna may include a conductor pattern implemented on the surface of the second supporting member 360 through, e.g., laser direct structuring. In an embodiment of the disclosure, the antenna may include a printed circuit pattern formed on the surface of the thin film. The thin film-type antenna may be disposed between the rear plate 380 and the battery 350. The antenna may include, e.g., a near-field communication (NFC) antenna, a wireless charging antenna, and/or a magnetic secure transmission (MST) antenna. The antenna may perform short-range communication with, e.g., an external device or may wirelessly transmit or receive power necessary for charging. In an embodiment of the disclosure, another antenna structure may be formed by a portion or combination of the side structure 310 and/or the first supporting member 311.

According to an embodiment of the disclosure, the camera assembly 307 may include at least one camera module. Inside the electronic device 101, the camera assembly 307 (or at least one camera module) may receive at least a portion of the light incident through the optical hole or the camera windows 312, 313, and 319. In an embodiment of the disclosure, the camera assembly 307 may be disposed on the first supporting member 311 in a position adjacent to the printed circuit boards 341 and 343. In an embodiment of the disclosure, the camera module(s) of the camera assembly 307 may be generally aligned with either one of the camera windows 312, 313, and 319 and be a least partially surrounded by the second supporting member 360 (e.g., the upper supporting member 360*a*).

According to an embodiment of the disclosure, the electronic device 101 may include a flexible connection member 345. The flexible connection member 345 may include a flexible flat cable (FFC), a flexible printed circuit board (FPCB), or a board to board (B2B) connector.

According to an embodiment of the disclosure, the flexible connection member 345 is at least partially bendable. For example, the flexible connection member 345 may be configured to be at least partially folded or unfolded.

According to an embodiment of the disclosure, the flexible connection member 345 may electrically connect the first circuit board 341 (e.g., a main circuit board) and at least one electrical component. For example, one end of the flexible connection member 345 may be physically and/or electrically connected to at least a portion of the first circuit board 341. For example, the other end of the flexible connection member 345 may be physically and/or electrically connected to at least a portion of the at least one electrical component. The at least one electrical component may include, e.g., a second circuit board 343 (e.g., a sub circuit board). However, at least one electrical component is not limited thereto but may include various electrical components (e.g., antenna, speaker, battery, display or sensor).

According to an embodiment of the disclosure, the flexible connection member 345 may be configured to transfer power or electrical signals from the first circuit board 341 to at least one electrical component. The flexible connection member 345 may be configured to transfer power or electrical signals from at least one electrical component to the first circuit board 341. The electrical signals may include control signals, power signals, or communication signals.

Figure 6:
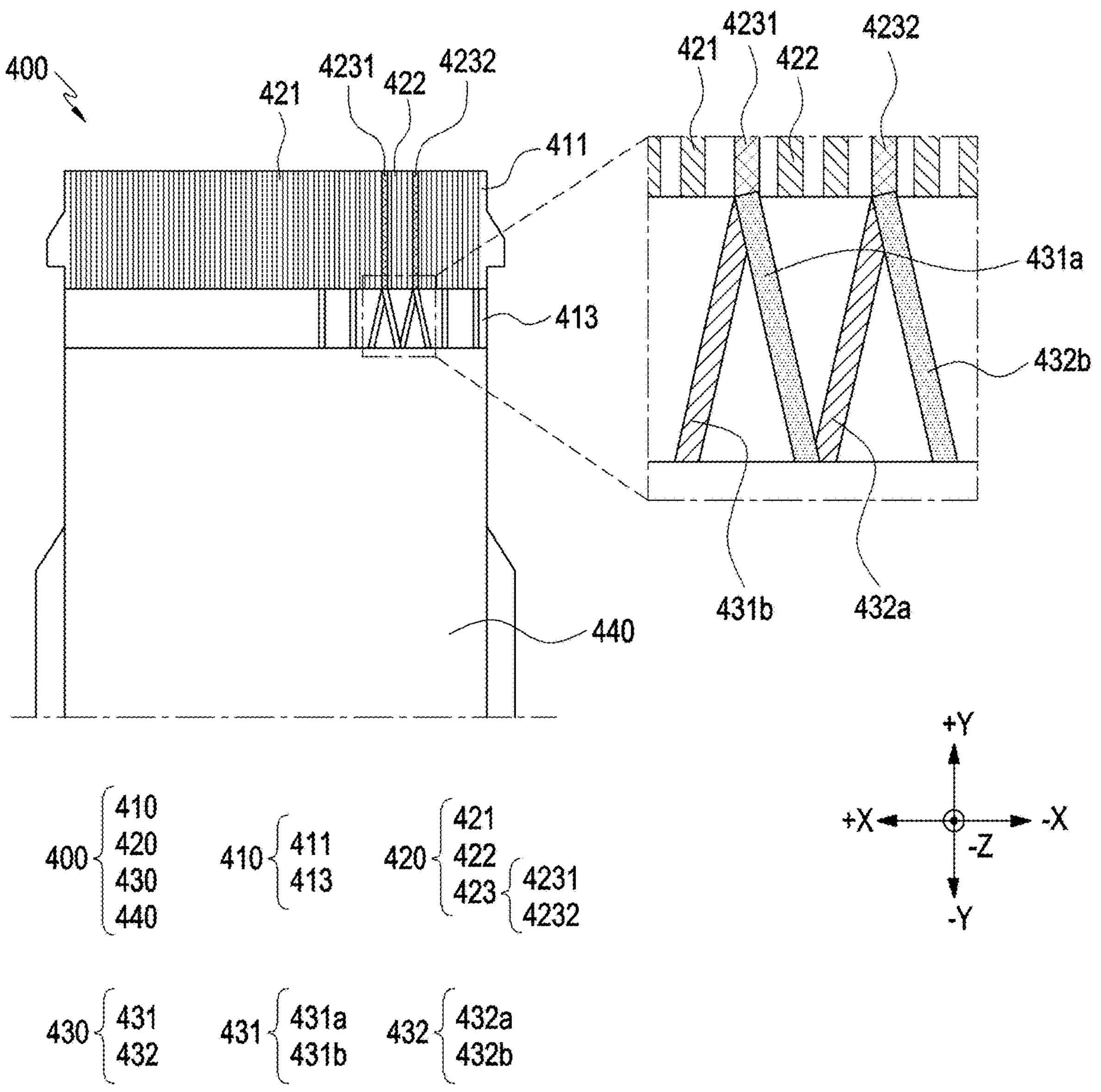
FIG. 6 is a plan view illustrating a flexible connection member according to an embodiment of the disclosure.

FIG. 6 is a plan view illustrating a flexible connection member according to an embodiment of the disclosure.

Figure 7:
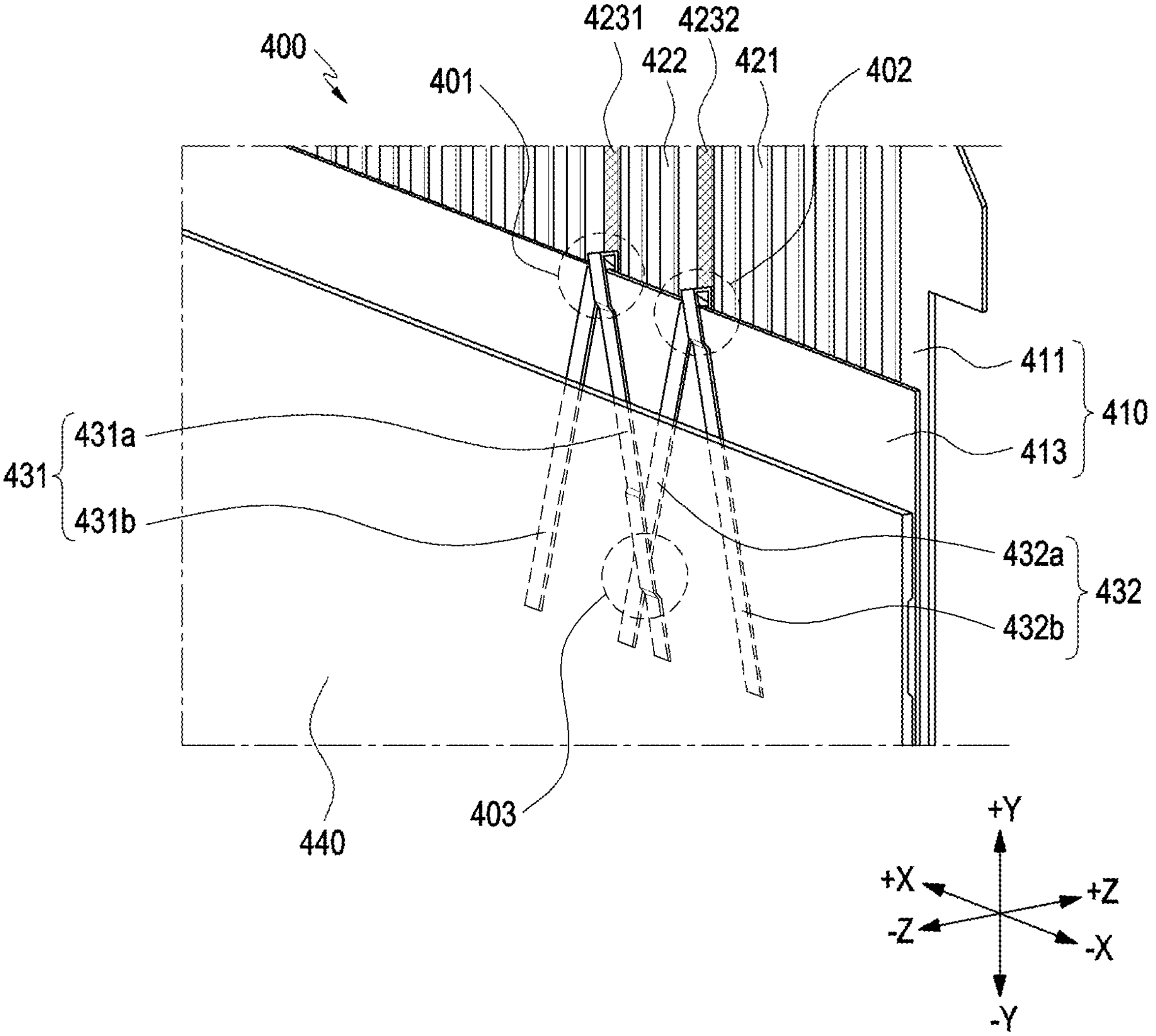
FIG. 7 is a partial perspective view illustrating a flexible connection member according to an embodiment of the disclosure.

FIG. 7 is a partial perspective view illustrating a flexible connection member according to an embodiment of the disclosure.

The embodiments of FIGS. 6 and 7 may be combined with the embodiments of FIGS. 1 to 5 or the embodiments of FIGS. 8 to 10, 11A, 11B, and 12.

Referring to FIGS. 6 and 7, a flexible flat cable 400 may include an insulation layer 410, at least one conductive line 420, at least one connection line 430, or a ground sheet 440.

The configuration of the flexible connection member 400 of FIGS. 6 and 7 may be identical in whole or part to the configuration of the flexible connection member 345 of FIGS. 4 and 5.

According to an embodiment of the disclosure, the flexible connection member 400 may be disposed in a housing (e.g., the housing 210 of FIGS. 2 and 3 or the housing 301 of FIGS. 4 and 5) of an electronic device (e.g., the electronic device 101 of FIG. 1 or the electronic device 101 of FIGS. 2 to 5).

According to an embodiment of the disclosure, the flexible connection member 400 may be configured to electrically connect a circuit board (e.g., the first circuit board 341 of FIGS. 4 and 5) disposed in the housing with at least one electrical component (e.g., the second circuit board 343 of FIGS. 4 and 5, or various electrical components).

According to an embodiment of the disclosure, the lines 420 and 430 of the flexible connection member 400 may include a conductor line formed of a conductive material or a metallic material.

Referring to the illustrated embodiment of the disclosure, at least a portion of the flexible connection member 400 is illustrated. Hereinafter, for convenience of description, a case in which at least a portion of the flexible connection member 400 illustrated in FIGS. 6 and 7 is connected to a first circuit board (e.g., the first circuit board 341 of FIGS. 4 and 5) is described as an example, but the description thereof may be applied, applied mutatis mutandis, and/or interpreted in the same and/or similar manner even when another portion of the flexible connection member 400 is connected to at least one electrical component.

According to an embodiment of the disclosure, the flexible connection member 400 may include an insulation layer 410 or at least one conductive line 420 disposed on the insulation layer 410. The at least one conductive line 420 may be configured to transmit power or an electrical signal between the first circuit board and at least one electrical component, or may be electrically connected to a ground of the first circuit board.

According to an embodiment of the disclosure, the insulation layer 410 may include a film formed of an insulating material. The insulation layer 410 may be defined and/or referred to as a cover layer or a coating layer of the flexible connection member 400.

According to an embodiment of the disclosure, the insulation layer 410 may include a first insulation layer 411 or a second insulation layer 413 stacked on the first insulation layer 411.

According to an embodiment of the disclosure, at least one conductive line 420 may be disposed on the first insulation layer 411. For example, the first insulation layer 411 may be configured to support at least one conductive line 420.

According to an embodiment of the disclosure, the second insulation layer 413 may cover a portion of the first insulation layer 411. For example, the second insulation layer 413 may be disposed to cover a portion of the first insulation layer 411 and not to cover the rest of the first insulation layer 411.

According to an embodiment of the disclosure, a portion of the at least one conductive line 420 located on the first insulation layer 411 not covered by the second insulation layer 413 may be visually exposed. A portion of the at least one visually exposed conductive line 420 may be physically and/or electrically connected to the first circuit board.

According to an embodiment of the disclosure, another portion of the at least one conductive line 420 located on the first insulation layer 411 covered by the second insulation layer 413 may not be visually exposed. As the other portion of the at least one conductive line 420 not visually exposed is disposed between the first insulation layer 411 and the second insulation layer 413 and sealed, damage or cutting may be limited or reduced.

According to an embodiment of the disclosure, the at least one conductive line 420 may be physically and/or electrically connected to a connector of the first circuit board. The at least one conductive line 420 may include signal lines 421 and 422 or at least one ground line 423. The signal line 421 may include a first signal line 421 or a second signal line 422 spaced apart from the first signal line 421.

According to an embodiment of the disclosure, the first signal line 421 may include a plurality of first signal lines. The first signal line 421 may be electrically connected to the first circuit board and at least one electrical component. The first signal line 421 may provide a conductive path for transmitting and receiving power or an electrical signal.

According to an embodiment of the disclosure, the second signal line 422 may be spaced apart from the first signal line 421. The second signal line 422 may be located between the first ground line 4231 and the second ground line 4232. The second signal line 422 may be electrically connected to the first circuit board and at least one electrical component. The second signal line 422 may provide a conductive path for transmitting and receiving power or an electrical signal. The second signal line 422 may be provided as a high-speed signal line. For example, the data transmission/reception speed of the second signal line 422 may be higher than the data transmission/reception speed of the first signal line 421. As an example, the second signal line 422 may be provided as a radio frequency signal (RF) line, but is not limited thereto.

According to an embodiment of the disclosure, the ground line 423 may be located between the first signal line 421 and the second signal line 422. The ground line 423 may be electrically connected to a ground of a first circuit board (e.g., the first circuit board 341 of FIGS. 4 and 5). Further, the ground line 423 may be electrically connected to the ground sheet 440 through at least one connection line 430.

According to an embodiment of the disclosure, the ground line 423 may include a first ground line 4231 or a second ground line 4232 spaced apart from the first ground line 4231. A second signal line 422 may be disposed between the first ground line 4231 and the second ground line 4232.

According to an embodiment of the disclosure, the first ground line 4231 may be electrically connected to the ground sheet 440 or a second connection part 432 through a first connection part 431. The second ground line 4232 may be electrically connected to the ground sheet 440 or the first connection part 431 through the second connection part 432.

According to an embodiment of the disclosure, the ground sheet 440 may be disposed on the second insulation layer 413. For example, the ground sheet 440 may be stacked on at least a portion of the second insulation layer 413. The ground sheet 440 may include a conductive material. For example, the ground sheet 440 may include a tape formed of a metallic material (e.g., gold, silver, copper, or aluminum).

According to an embodiment of the disclosure, the ground sheet 440 may provide a shielding structure for the first signal line 421 or the second signal line 422. For example, the ground sheet 440 may be configured to block electromagnetic waves generated from electrical/electronic components disposed inside the electronic device from being transferred to the first signal line 421 or the second signal line 422. Further, the ground sheet 440 may be configured to block electromagnetic waves generated from the first signal line 421 or the second signal line 422 from being transferred to electrical/electronic components disposed inside the electronic device.

According to an embodiment of the disclosure, the ground sheet 440 may be electrically connected to the first ground line 4231 or the second ground line 4232 through at least one connection line 430. As the first ground line 4231 and/or the second ground line 4232 is electrically connected to the ground of the first circuit board, the ground sheet 440 may be electrically connected to the ground of the first circuit board through the at least one connection line 430 and the ground lines 4231 and 4232.

According to an embodiment of the disclosure, the at least one connection line 430 may include a first connection part 431 or a second connection part 432.

According to an embodiment of the disclosure, the first connection part 431 may be electrically connected to the first ground line 4231. The first connection part 431 may extend from the first ground line 4231. The first connection part 431 may include a first connection line 431*a* or a third connection line 431*b*. The first connection line 431*a* may be electrically connected to the first ground line 4231. At least a portion of the first connection line 431*a* may extend in a first direction. For example, the first connection line 431*a* may be disposed or extended to form an acute angle with the first ground line 4231. The first direction may be a direction inclined with respect to the extending direction (e.g., the Y-axis direction of FIGS. 6 and 7) of the first ground line 4231. For example, the first direction may form an acute angle with the extending direction (e.g., the Y-axis direction of FIGS. 6 and 7) of the first ground line 4231. The third connection line 431*b* may be electrically connected to the first ground line 4231. The third connection line 431*b* may extend in a direction different from the first direction. A portion of the first ground line 4231 may overlap a portion of the first connection line 431*a* and/or a portion of the third connection line 431*b* in the thickness direction (e.g., the Z-axis direction of FIGS. 6 and 7) of the flexible connection member 400.

According to an embodiment of the disclosure, the first connection line 431*a* may contact the second connection line 432*a*. For example, the first connection line 431*a* may cross the second connection line 432*a*. A portion (e.g., a portion crossing the second connection line 432*a*) of the first connection line 431*a* may contact the second connection line 432*a*. Accordingly, the first connection line 431*a* may be electrically connected to the second connection line 432*a*.

According to an embodiment of the disclosure, the second connection part 432 may be electrically connected to the second ground line 4232. The second connection part 432 may extend from the second ground line 4232. The second connection part 432 may include a second connection line 432*a* or a fourth connection line 432*b*. The second connection line 432*a* may be electrically connected to the second ground line 4232. At least a portion of the second connection line 432*a* may extend in the second direction. For example, the second connection line 432*a* may be disposed or extended to form an acute angle with the second ground line 4232. The second direction may be a direction inclined with respect to the extending direction (e.g., the Y-axis direction of FIGS. 6 and 7) of the second ground line 4232. For example, the second direction may form an acute angle with the extending direction (e.g., the Y-axis direction of FIGS. 6 and 7) of the second ground line 4232. The second direction may be a direction different from the first direction, which is the extending direction of the first connection line 431*a*. The fourth connection line 432*b* may be electrically connected to the second ground line 4232. The fourth connection line 432*b* may extend in a direction different from the second direction. A portion of the second ground line 4232 may overlap a portion of the second connection line 432*a* and/or a portion of the fourth connection line 432*b* in the thickness direction (e.g., the Z-axis direction of FIGS. 6 and 7) of the flexible connection member 400.

According to an embodiment of the disclosure, the second connection line 432*a* may contact the first connection line 431*a*. For example, the second connection line 432*a* may cross the first connection line 431*a*. A portion (e.g., a portion crossing the first connection line 431*a*) of the second connection line 432*a* may contact the first connection line 431*a*. Accordingly, the second connection line 432*a* may be electrically connected to the first connection line 431*a*.

According to an embodiment of the disclosure, at least a portion of the third connection line 431*b* may contact the ground sheet 440. At least a portion of the fourth connection line 432*b* may contact the ground sheet 440.

According to an embodiment of the disclosure, the ground sheet 440 may be electrically connected to the first ground line 4231 through the third connection line 431*b*. Further, the ground sheet 440 may be electrically connected to the first ground line 4231 through the first connection line 431*a*. The ground sheet 440 may provide a ground for the first ground line 4231.

According to an embodiment of the disclosure, the ground sheet 440 may be electrically connected to the second ground line 4232 through the fourth connection line 432*b*. Further, the ground sheet 440 may be electrically connected to the second ground line 4232 through the second connection line 432*a*. The ground sheet 440 may provide a ground for the second ground line 4232.

According to an embodiment of the disclosure, as the second signal line 422 (e.g., the high-speed signal line) is located between the first ground line 4231 and the second ground line 4232, the first ground line 4231 and the second ground line 4232 may provide a shielding structure for the second signal line 422. Further, as the first ground line 4231 and the second ground line 4232 remain electrically connected to the ground of the first circuit board or the ground of the ground sheet 440, the impedance change of the second signal line 422 (e.g., the high-speed signal line) may be limited or reduced. Accordingly, the occurrence of loss of an electrical signal transferred through the second signal line 422 may be limited or reduced.

According to an embodiment of the disclosure, the ground sheet 440 may be configured to provide a shielding structure or a shielding function for the first signal line 421 or the second signal line 422. Further, the first ground line 4231 and/or the second ground line 4232 may be configured to provide a shielding structure or a shielding function for the second signal line 422. For example, the ground sheet 440, the first ground line 4231, and/or the second ground line 4232 may provide an electromagnetic interference (EMI) shielding structure for the first signal line 421 and/or the second signal line 422. For example, as the ground sheet 440, the first ground line 4231, and/or the second ground line 4232 limits or reduces the occurrence of the impedance change of the first signal line 421 and/or the second signal line 422, the loss of power or electrical signal transferred through the second signal line 422 may be limited or reduced, and the power integrity (PI) and/or signal integrity (SI) of the second signal line 422 may be enhanced or improved.

According to an embodiment of the disclosure, the flexible connection member 400 may include a first connection area 401, a second connection area 402, or a third connection area 403. The connection areas 401, 402, and 403 may be defined and/or referred to as connection structures.

According to an embodiment of the disclosure, in the first connection area 401, a portion of the first ground line 4231 may be electrically connected to a portion of the first connection line 431*a* and/or a portion of the third connection line 431*b*. The first connection area 401 may be defined as an area in which the first ground line 4231, the first connection line 431*a*, and the third connection line 431*b* overlap each other. A portion of the first connection line 431*a* may contact the first ground line 4231 and the third connection line 431*b* between the first insulation layer 411 and the second insulation layer 413. The rest of the first connection line 431*a* may not be located between the first insulation layer 411 and the second insulation layer 413, and may extend in the first direction on the second insulation layer 413. A portion of the third connection line 431*b* may contact the first connection line 431*a* between the first insulation layer 411 and the second insulation layer 413. At least a portion of the third connection line 431*b* may overlap the first connection line 431*a* and the first ground line 4231, with respect to a third direction (e.g., the Z-axis direction of FIGS. 6 and 7) from the first insulation layer 411 toward the second insulation layer 413.

According to an embodiment of the disclosure, in the second connection area 402, a portion of the second ground line 4232 may be electrically connected to a portion of the second connection line 432*a* and/or a portion of the fourth connection line 432*b*. The second connection area 402 may be defined as an area in which the second ground line 4232, the second connection line 432*a*, and the fourth connection line 432*b* overlap each other. A portion of the second connection line 432*a* may contact the second ground line 4232 and the fourth connection line 432*b* between the first insulation layer 411 and the second insulation layer 413. The rest of the second connection line 432*a* may not be located between the first insulation layer 411 and the second insulation layer 413, and may extend in the second direction on the second insulation layer 413. For example, a portion of the rest of the second connection line 432*a* may cross the first connection line 431*a* and may contact the first connection line 431*a*. At least a portion of the fourth connection line 432*b* may overlap the second connection line 432*a* and the second ground line 4232 with respect to the third direction (e.g., the Z-axis direction of FIGS. 6 and 7).

According to an embodiment of the disclosure, in the third connection area 403, a portion of the first connection line 431*a* may contact a portion of the second connection line 432*a*. For example, in the third connection area 403, a portion of the first connection line 431*a* may be electrically connected to a portion of the second connection line 432*a*. The third connection area 403 may be defined as a portion 403 where the first connection line 431*a* and the second connection line 432*a* cross each other.

According to an embodiment of the disclosure, as the first connection line 431*a* and the second connection line 432*a* are electrically connected in the third connection area 403, the electrical connection states of the ground sheet 440, the first ground line 4231, and the second ground line 4232 may remain good.

According to an embodiment of the disclosure, the first ground line 4231 may be electrically connected to the ground sheet 440 through a conductive path by the third connection line 431*b*, a conductive path by the first connection line 431*a*, or a conductive path by the second connection part 432 (e.g., the second connection line 432*a* and/or the fourth connection line 432*b*).

For example, when the contact state between the third connection line 431*b* and the ground sheet 440 is a bad contact state, the first ground line 4231 may not be electrically connected to the ground of the ground sheet 440 through the third connection line 431*b*. In this case, the first ground line 4231 may be electrically connected to the ground of the ground sheet 440 through the first connection line 431*a*. Further, the first ground line 4231 may be electrically connected to the ground of the ground sheet 440 through the second connection line 432*a* contacting the first connection line 431*a*. Further, the first ground line 4231 may be electrically connected to the ground of the ground sheet 440 through the second connection line 432*a* and the fourth connection line 432*b* electrically connected to the first connection line 431*a*. Accordingly, as the electrical connection state between the first ground line 4231 and the ground of the ground sheet 440 remains good, the SI of the electrical signal transferred through the second signal line 422 may be enhanced or improved. The description of the electrical connection state between the first ground line 4231 and the ground of the ground sheet 440 may be applied to and/or applied mutatis mutandis to the electrical connection state between the second ground line 4232 and the ground of the ground sheet 440 in the same or similar manner.

Figure 8:
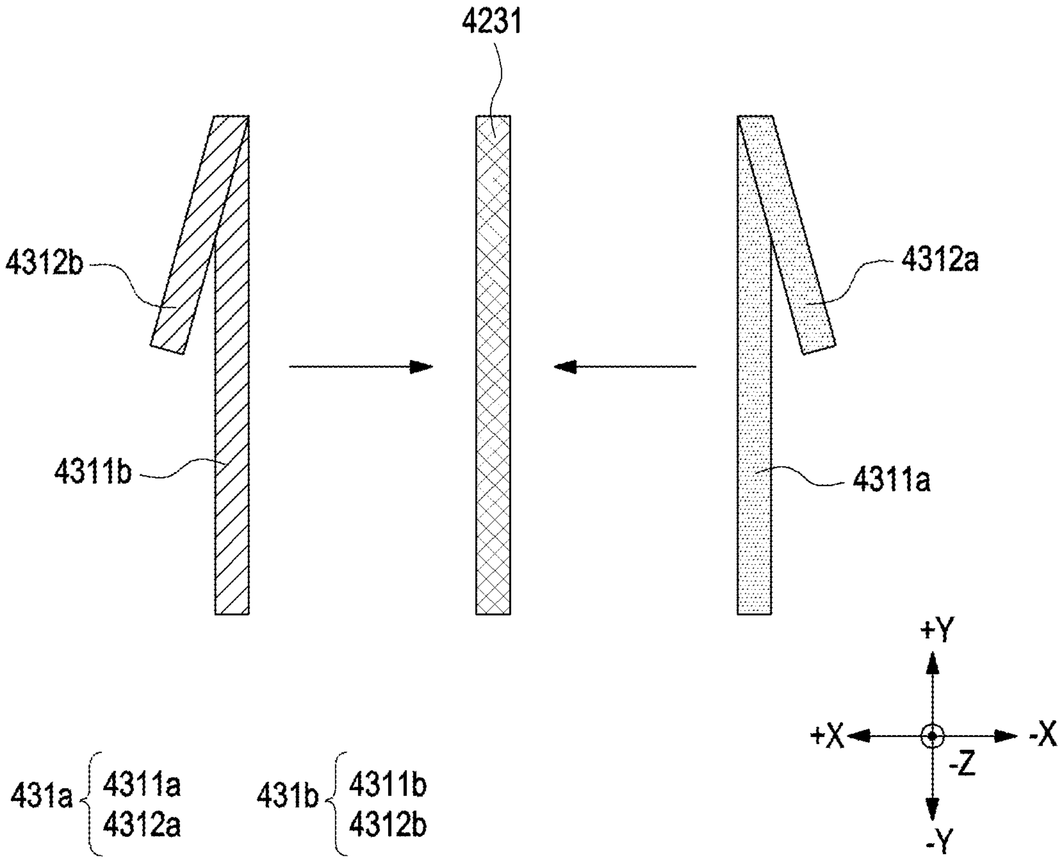
FIG. 8 is a view schematically illustrating a state before a first ground line, a first connection line, and a third connection line are connected according to an embodiment of the disclosure.

FIG. 8 is a view schematically illustrating a state before a first ground line, a first connection line, and a third connection line are connected according to an embodiment of the disclosure.

Figure 9:
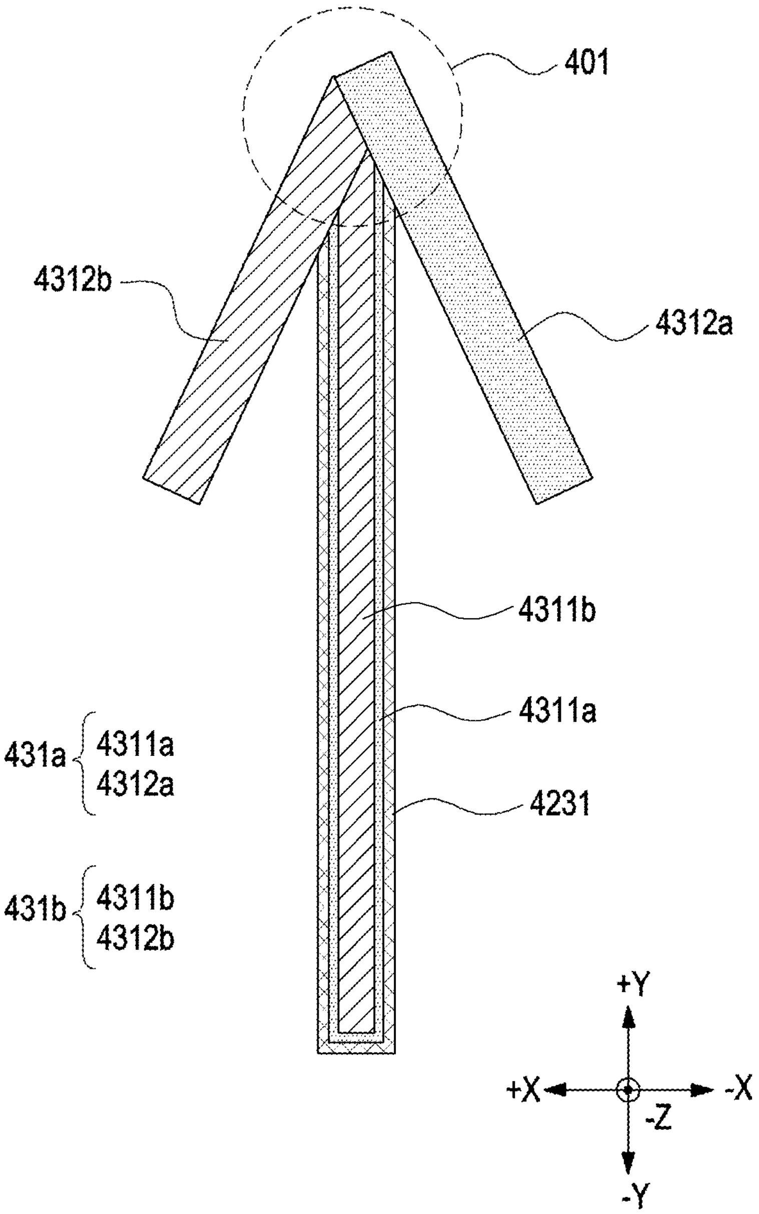
FIG. 9 is a view schematically illustrating a state after a first ground line, a first connection line, and a third connection line are connected according to an embodiment of the disclosure.

FIG. 9 is a view schematically illustrating a state after a first ground line, a first connection line, and a third connection line are connected according to an embodiment of the disclosure.

Figure 10:
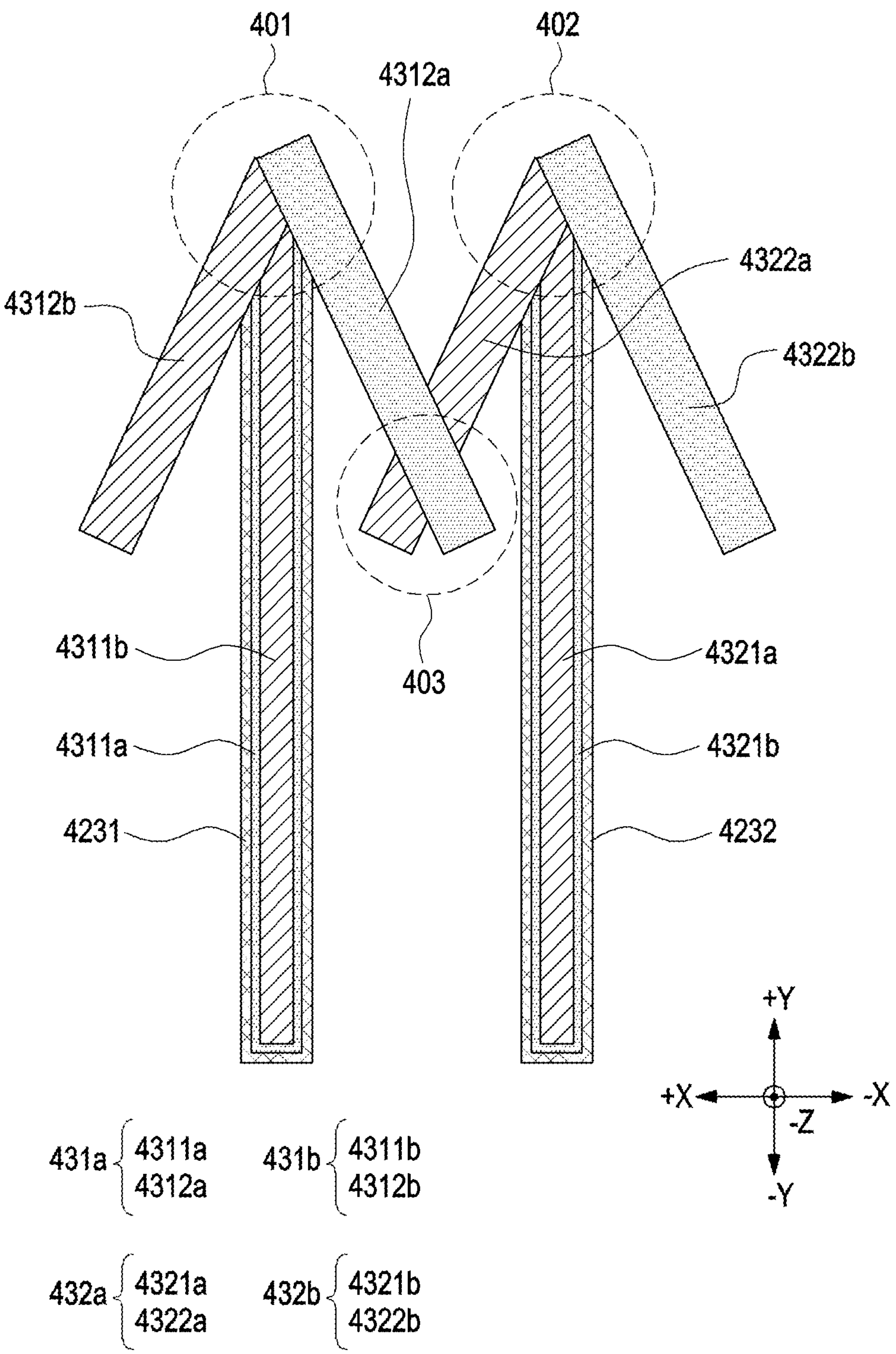
FIG. 10 is a view schematically illustrating a state after ground lines and connection lines are connected according to an embodiment of the disclosure.

FIG. 10 is a view schematically illustrating a state after ground lines and connection lines are connected according to an embodiment of the disclosure.

Figure 11A:
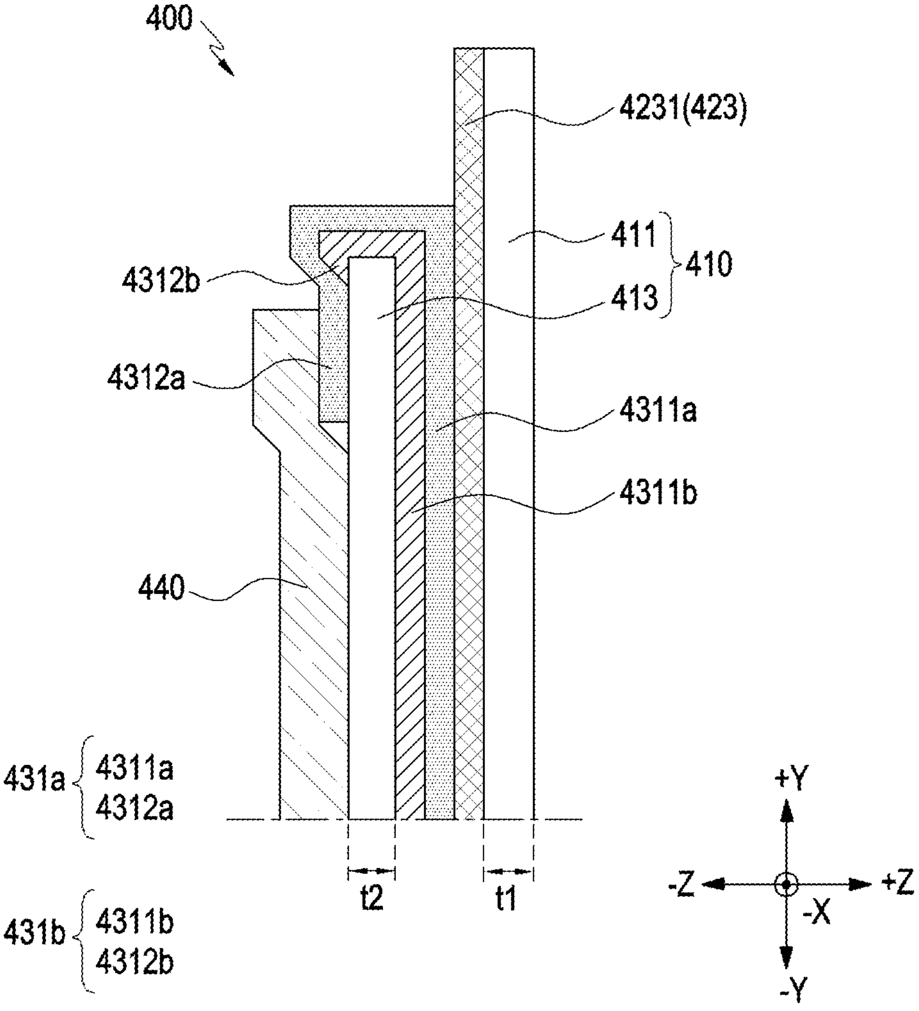
FIG. 11A is a cross-sectional view illustrating a flexible connection member according to an embodiment of the disclosure.
Figure 11B:
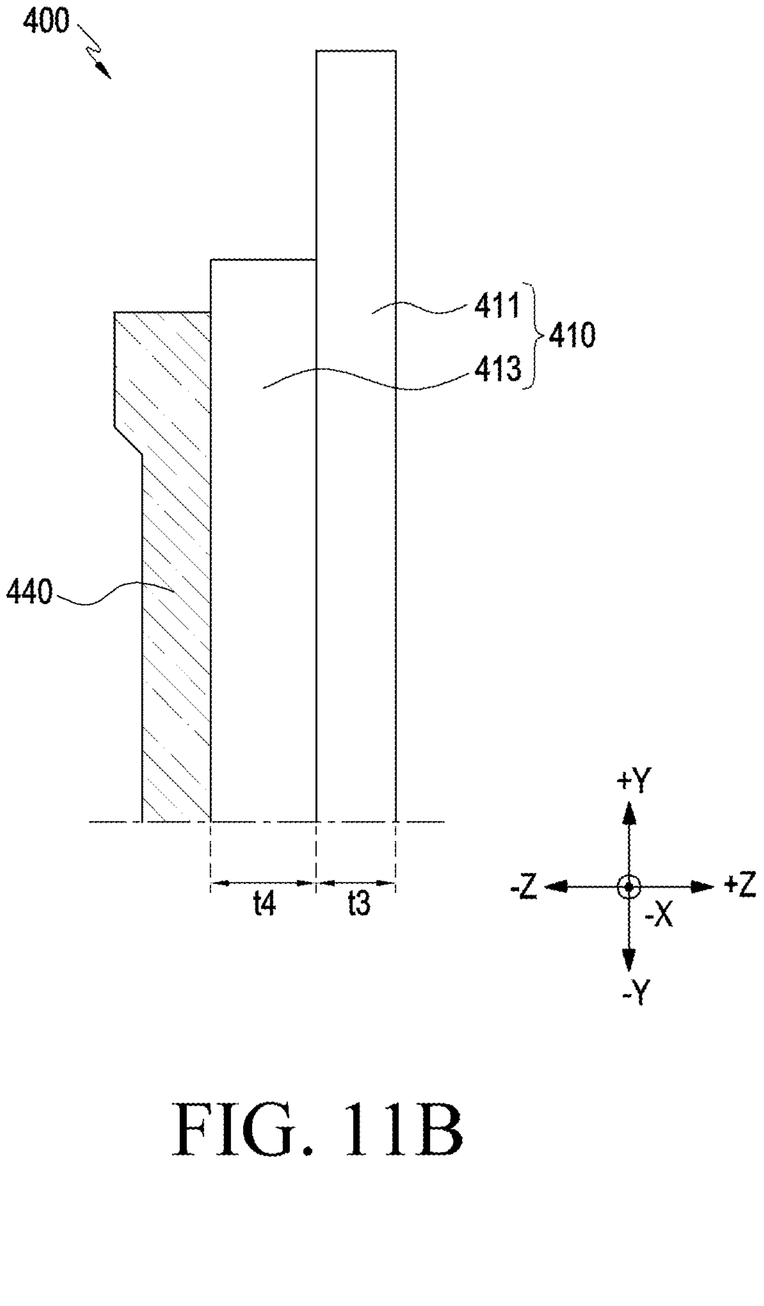
FIG. 11B is a cross-sectional view illustrating a flexible connection member according to an embodiment of the disclosure.
Figure 12:
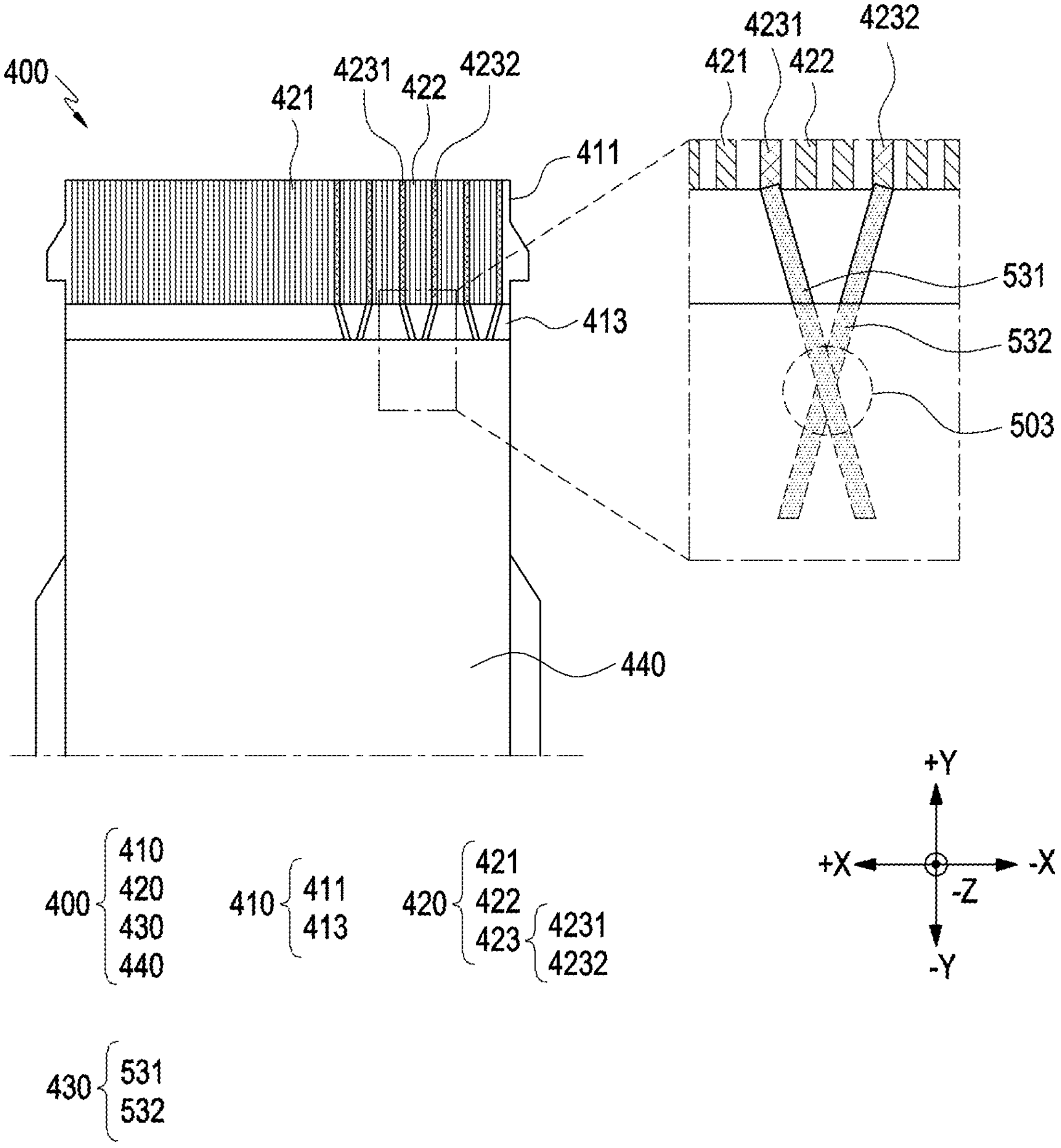
FIG. 12 is a plan view illustrating a flexible connection member according to an embodiment of the disclosure.

The embodiments of FIGS. 8 to 10 may be combined with the embodiments of FIGS. 1 to 9, or the embodiments of FIGS. 11A, 11B, and 12.

Referring to FIG. 8, a first ground line 4231 (e.g., the first ground line 4231 of FIGS. 6 and 7) may extend along a length direction (e.g., the Y-axis direction of FIGS. 8 to 10) of a flexible connection member (e.g., the flexible connection member 400 of FIGS. 6 and 7).

According to an embodiment of the disclosure, the first connection line 431*a* (e.g., the first connection line 431*a* of FIGS. 6 and 7) may include a first connection portion 4311*a* or a first extension portion 4312*a*. The first connecting portion 4311*a* may extend in substantially the same direction as the extending direction (e.g., the Y-axis direction of FIGS. 8 to 10) of the first ground line 4231. The first extension portion 4312*a* may extend from one end of the first connection portion 4311*a* in the first direction. The first direction may be inclined with respect to the extending direction of the first connection portion 4311*a*. For example, the first direction may form an acute angle with the extending direction of the first connection portion 4311*a*.

According to an embodiment of the disclosure, the first extension portion 4312*a* may be provided in a folded state with respect to the first connection portion 4311*a*. For example, as at least a portion of the first connection line 431*a* is folded, the first extension portion 4312*a* and the first connection portion 4311*a* may be provided.

According to an embodiment of the disclosure, the third connection line 431*b* (e.g., the third connection line 431*b* of FIGS. 6 and 7) may include a third connection portion 4311*b* or a third extension portion 4312*b*. The third connection portion 4311*b* may extend in substantially the same direction as the extending direction of the first ground line 4231. The third extension portion 4312*b* may extend from one end of the third connection portion 4311*b* in a direction different from the first direction. For example, the extending direction of the third extension 4312*b* may be a direction different from the first direction which is the extending direction of the first extension portion 4312*a*. The extending direction of the third extension portion 4312*b* may be inclined with respect to the extending direction of the third connection portion 4311*b*. For example, the third extension portion 4312*b* may be disposed or extended to form an acute angle with the third connection portion 4311*b*.

According to an embodiment of the disclosure, the third extension portion 4312*b* may be provided in a folded state with respect to the third connection portion 4311*b*. For example, as at least a portion of the third connection line 431*b* is folded, the third extension portion 4312*b* and the third connection portion 4311*b* may be provided.

FIG. 9 illustrates a structure in which the first connection portion 4311*a* of the first connection line 431*a* is directly stacked on the first ground line 4231, and the third connection portion 4311*b* of the third connection line 431*b* is directly stacked on the first connection portion 4311*a*. According to an embodiment of the disclosure, as the first ground line 4231, the first connection line 431*a*, and the third connection line 431*b* overlap each other in the first connection area 401 (e.g., the first connection area 401 of FIG. 7), the first ground line 4231, the first connection line 431*a*, and the third connection line 431*b* may be electrically connected to each other. Although not illustrated, the stacked state of the first ground line 4231, the first connection line 431*a*, and the third connection line 431*b* may be provided as a state in which the third connection portion 4311*b* of the third connection line 431*b* is directly stacked on the first ground line 4231, and the first connection portion 4311*a* of the first connection line 431*a* is directly stacked on the third connection portion 4311*b*.

According to an embodiment of the disclosure, at least a portion of the third connection portion 4311*b* and at least a portion of the third extension portion 4312*b* may be disposed between the first connection portion 4311*a* and the first extension portion 4312*a*. Although not illustrated, at least a portion of the first connection portion 4311*a* and at least a portion of the first extension portion 4312*a* may be disposed between the third connection portion 4311*b* and the third extension portion 4312*b*.

According to an embodiment of the disclosure, the first ground line 4231, the first connection portion 4311*a*, and the third connection portion 4311*b* may be located between a first insulation layer (e.g., the first insulation layer 411 of FIGS. 6 and 7) and a second insulation layer (e.g., the second insulation layer 413 of FIGS. 6 and 7).

According to an embodiment of the disclosure, at least a portion of the first extension portion 4312*a* and at least a portion of the third extension portion 4312*b* may be located between a second insulation layer (e.g., the second insulation layer 413 of FIGS. 6 and 7) and a ground sheet (e.g., the ground sheet 440 of FIGS. 6 and 7).

Referring to FIG. 10, a second ground line 4232 (e.g., the second ground line 4232 of FIGS. 6 and 7) may extend along a length direction (e.g., the Y-axis direction of FIGS. 8 to 10) of a flexible connection member (e.g., the flexible connection member 400 of FIGS. 6 and 7).

According to an embodiment of the disclosure, the second connection line 432*a* (e.g., the second connection line 432*a* of FIGS. 6 and 7) may include a second connection portion 4321*a* or a second extension portion 4322*a*. The second connection portion 4321*a* may extend in substantially the same direction as the extending direction (e.g., the Y-axis direction of FIGS. 8 to 10) of the second ground line 4232. The second extension portion 4322*a* may extend from one end of the second connection portion 4321*a* in the second direction. The second direction may be inclined with respect to the extending direction of the second connection portion 4321*a*. For example, the second direction may form an acute angle with the extending direction of the second connection portion 4321*a*.

According to an embodiment of the disclosure, the second extension portion 4322*a* may be provided in a folded state with respect to the second connection portion 4321*a*. For example, as at least a portion of the second connection line 432*a* is folded, the second extension portion 4322*a* and the second connection portion 4321*a* may be provided.

According to an embodiment of the disclosure, the fourth connection line 432*b* (e.g., the fourth connection line 432*b* of FIGS. 6 and 7) may include a fourth connection portion 4321*b* or a fourth extension portion 4322*b*. The fourth connection portion 4321*b* may extend in substantially the same direction as the extending direction of the second ground line 4232. The fourth extension portion 4322*b* may extend from one end of the fourth connection portion 4321*b* in a direction different from the second direction. For example, the extending direction of the fourth extension portion 4322*b* may be a direction different from the second direction which is the extending direction of the second extension portion 4322*a*. The extending direction of the fourth extension portion 4322*b* may be inclined with respect to the extending direction of the fourth connection portion 4321*b*. For example, the fourth extension portion 4322*b* may be disposed or extended to form an acute angle with the fourth connection portion 4321*b*.

According to an embodiment of the disclosure, the fourth extension portion 4322*b* may be provided in a folded state with respect to the fourth connection portion 4321*b*. For example, as at least a portion of the fourth connection line 432*b* is folded, the fourth extension portion 4322*b* and the fourth connection portion 4321*b* may be provided.

According to an embodiment of the disclosure, illustrated is a structure in which the fourth connection portion 4321*b* of the fourth connection line 432*b* is directly stacked on the second ground line 4232, and the second connection portion 4321*a* of the second connection line 432*a* is directly stacked on the fourth connection portion 4321*b*. According to an embodiment of the disclosure, as the second ground line 4232, the second connection line 432*a*, and the fourth connection line 432*b* overlap each other in the second connection area 402 (e.g., the second connection area 402 of FIG. 7), the second ground line 4232, the second connection line 432*a*, and the fourth connection line 432*b* may be electrically connected to each other. Although not illustrated, the stacked state of the second ground line 4232, the second connection line 432*a*, and the fourth connection line 432*b* may be provided as a state in which the second connection portion 4321*a* of the second connection line 432*a* is directly stacked on the second ground line 4232, and the fourth connection portion 4321*b* of the fourth connection line 432*b* is directly stacked on the second connection portion 4321*a*.

According to an embodiment of the disclosure, at least a portion of the second connection portion 4321*a* and at least a portion of the second extension portion 4322*a* may be disposed between the fourth connection portion 4321*b* and the fourth extension portion 4322*b*. Although not illustrated, at least a portion of the fourth connection portion 4321*b* and at least a portion of the fourth extension portion 4322*b* may be disposed between the second connection portion 4321*a* and the second extension portion 4322*a*.

According to an embodiment of the disclosure, the second ground line 4232, the second connection portion 4321*a*, and the fourth connection portion 4321*b* may be located between a first insulation layer (e.g., the first insulation layer 411 of FIGS. 6 and 7) and a second insulation layer (e.g., the second insulation layer 413 of FIGS. 6 and 7).

According to an embodiment of the disclosure, at least a portion of the second extension portion 4322*a* and at least a portion of the fourth extension portion 4322*b* may be located between the second insulation layer (e.g., the second insulation layer 413 of FIGS. 6 and 7) and the ground sheet (e.g., the ground sheet 440 of FIGS. 6 and 7).

Referring to FIG. 10, the first extension portion 4312*a* and the second extension portion 4322*a* may cross each other in the third connection area 403 (e.g., the third connection area 403 of FIG. 7). As the first extension portion 4312*a* and the second extension portion 4322*a* directly contact each other in the third connection area 403, the first connection line 431*a* may be electrically connected to the second connection line 432*a*. According to an embodiment of the disclosure, in the third connection area 403, the first extension portion 4312*a* may contact a ground sheet (e.g., the ground sheet 440 of FIGS. 6 and 7), and the second extension portion 4322*a* may contact a second insulation layer (e.g., the second insulation layer 413 of FIGS. 6 and 7). Although not illustrated, in the third connection area 403, the contact state between the first extension portion 4312*a* and the second extension portion 4322*a* may be provided so that the second extension portion 4322*a* contacts the ground sheet and the first extension portion 4312*a* contacts the second insulation layer.

FIG. 11A is a cross-sectional view illustrating a flexible connection member according to an embodiment of the disclosure.

FIG. 11B is a cross-sectional view illustrating a flexible connection member according to an embodiment of the disclosure.

The embodiments of FIGS. 11A and 11B may be combined with the embodiments of FIGS. 1 to 10, or the embodiment of FIG. 12.

FIG. 11A illustrates a stacking relationship between a first ground line 4231, a first connection line 431*a*, and a third connection line 431*b*. The description of the first ground line 4231, the first connection line 431*a*, and the third connection line 431*b* described with reference to FIG. 11A may be equally or similarly applied and/or applied mutatis mutandis to the second ground line (e.g., the second ground line 4232 of FIGS. 6 and 7, or 10), the second connection line (e.g., the second connection line 432*a* of FIGS. 6 and 7, or 10), and the fourth connection line (e.g., the fourth connection line 432*b* of FIGS. 6 and 7, or 10) illustrated in FIGS. 6 to 10.

FIG. 11B illustrates a flexible connection member 400 viewed on a plane (e.g., a virtual plane including the Y axis and the Z axis of FIGS. 11A and 11B) different from that of FIG. 11A.

Referring to FIGS. 11A and 11B, a flexible connection member 400 (e.g., the flexible connection member 345 of FIGS. 4 and 5, or the flexible connection member 400 of FIGS. 6 and 7) may include an insulation layer 410, at least one ground line 423, a first connection line 431*a*, a third connection line 431*b*, or a ground sheet 440.

The configuration of the insulation layer 410, the at least one ground line 423, the first connection line 431*a*, the third connection line 431*b*, or the ground sheet 440 of FIGS. 11A and 11B may be identical in whole or part to the configuration of the insulation layer 410, the at least one ground line 423, the first connection line 431*a*, the third connection line 431*b*, or the ground sheet 440 of FIGS. 6 and 7.

According to an embodiment of the disclosure, the insulation layer 410 may include a first insulation layer 411 (e.g., the first insulation layer 411 of FIGS. 6 and 7) or a second insulation layer 413 (e.g., the second insulation layer 413 of FIGS. 6 and 7) spaced apart from the first insulation layer 411.

According to an embodiment of the disclosure, the at least one ground line 423 may include a first ground line (e.g., the ground line 4231 of FIGS. 6 and 7).

According to an embodiment of the disclosure, the first ground line 4231 may be disposed on the first insulation layer 411. For example, the first ground line 4231 may be disposed in a groove (or recess) recessed in the first insulation layer 411. For example, the first ground line 4231 may be accommodated in the groove of the first insulation layer 411 having a shape corresponding to the shape of the first ground line 4231. For example, a first thickness t1 (e.g., the thickness t1 in the Z-axis direction of FIG. 11A) of the first insulation layer 411 of the portion where the first ground line 4231 is located may be smaller than a third thickness t3 (e.g., the thickness t3 in the Z-axis direction of FIG. 11B) of the first insulation layer 411 of the portion where the first ground line 4231 is not located.

According to an embodiment of the disclosure, the first connection line 431*a* may include a first connection portion 4311*a* (e.g., the first connection portion 4311*a* of FIGS. 8 to 10) or a first extension portion 4312*a* (e.g., the first extension portion 4312*a* of FIGS. 8 to 10) extending from one end (e.g., an end portion facing in the +Y direction of FIG. 11A) of the first connection portion 4311*a*.

According to an embodiment of the disclosure, the third connection line 431*b* may include a third connection portion 4311*b* (e.g., the third connection portion 4311*b* of FIGS. 8 to 10) or a third extension portion 4312*b* (e.g., the third extension portion 4312*b* of FIGS. 8 to 10) extending from one end (e.g., an end facing in the +Y direction of FIG. 11A) of the third connection portion 4311*b*.

According to an embodiment of the disclosure, the first connection portion 4311*a* and/or the third connection portion 4311*b* may be disposed on the second insulation layer 413. For example, the first connection portion 4311*a* and/or the third connection portion 4311*b* may be disposed on one surface (e.g., a surface facing in the +Z direction of FIG. 11A) of the second insulation layer 413. For example, the first connection portion 4311*a* and/or the third connection portion 4311*b* may be disposed in a groove (or recess) recessed in one surface (e.g., a surface facing in the +Z direction in FIG. 11A) of the second insulation layer 413. For example, the first connection portion 4311*a* and/or the third connection portion 4311*b* may be accommodated in the groove of the second insulation layer 413 having a shape corresponding to the shape of the first connection portion 4311*a* and/or the third connection portion 4311*b*. For example, a second thickness t2 (e.g., the thickness t2 in the Z-axis direction of FIG. 11A) of the second insulation layer 413 of the portion where the first connection portion 4311*a* and/or the third connection portion 4311*b* is located may be smaller than a fourth thickness t4 (e.g., the thickness t4 in the Z-axis direction of FIG. 11B) of the second insulation layer 413 of the portion where the first connection portion 4311*a* and/or the third connection portion 4311*b* is not located.

According to an embodiment of the disclosure, the first extension portion 4312*a* and/or the third extension portion 4312*b* may be disposed on the second insulation layer 413. For example, the first extension portion 4312*a* and/or the third extension portion 4312*b* may be disposed on the other surface (e.g., the surface facing in the −Z direction in FIG. 11A) of the second insulation layer 413.

According to an embodiment of the disclosure, the first connection portion 4311*a* may be located between the third connection portion 4311*b* and the first ground line 4231. Although not shown, the third connection portion 4311*b* may be located between the first connection portion 4311*b* and the first ground line 4231.

According to an embodiment of the disclosure, the ground sheet 440 may be stacked on at least a portion of the second insulation layer 413. For example, the ground sheet 440 may be adhered to at least a portion of the second insulation layer 413.

According to an embodiment of the disclosure, the ground sheet 440 may contact the first extension portion 4312*a* and may be electrically connected to the first extension portion 4312*a*. Further, the ground sheet 440 may contact the third extension portion 4312*b* and may be electrically connected to the third extension portion 4312*b*.

FIG. 12 is a plan view illustrating a flexible connection member according to an embodiment of the disclosure.

The embodiment of FIG. 12 may be combined with the embodiments of FIGS. 1 to 10, 11A, and 11B.

Referring to FIG. 12, a flexible connection member 400 (e.g., the flexible connection member 400 of FIGS. 4 and 5, the flexible connection member 400 of FIGS. 6 and 7, or the flexible connection member 400 of FIGS. 11A and 11B) may include an insulation layer 410, at least one conductive line 420, at least one connection line 430, or a ground sheet 440.

The configuration of the insulation layer 410, the at least one conductive line 420, the at least one connection line 430, or the ground sheet 440 of FIG. 12 may be identical in whole or part to the configuration of the insulation layer 410, the at least one conductive line 420, the at least one connection line 430, or the ground sheet 440 of FIGS. 6 and 7.

According to an embodiment of the disclosure, the insulation layer 410 may include a first insulation layer 411 (e.g., the first insulation layer 411 of FIGS. 6 and 7) or a second insulation layer 413 (e.g., the second insulation layer 413 of FIGS. 6 and 7).

According to an embodiment of the disclosure, the at least one conductive line 420 may include a first signal line 421 (e.g., the first signal line 421 of FIGS. 6 and 7), a second signal line (e.g., the second signal line 422 of FIGS. 6 and 7), or at least one ground line 423 (e.g., the at least one ground line 423 of FIGS. 6 and 7). The at least one ground line 423 may include a first ground line 4231 (e.g., the first ground line 4231 of FIGS. 6 and 7) or a second ground line 4232 (e.g., the second ground line 4232 of FIGS. 6 and 7).

According to an embodiment of the disclosure, the at least one connection line 430 may include a first connection line 531 (e.g., the first connection line 431*a* of FIGS. 6 to 10, and 11A) or a second connection line 532 (e.g., the second connection line 432*a* of FIGS. 6 to 8 or 10).

According to an embodiment of the disclosure, the first connection line 531 may be electrically connected to the first ground line 4231. Further, the first connection line 531 may be electrically connected to the ground sheet 440.

According to an embodiment of the disclosure, the second connection line 532 may be electrically connected to the second ground line 4232. Further, the second connection line 532 may be electrically connected to the ground sheet 440.

According to an embodiment of the disclosure, in a third connection area 503 (e.g., the third connection area 403 of FIG. 7 or the third connection area 403 of FIG. 10), a portion of the first connection line 531 may contact a portion of the second connection line 532. For example, in the third connection area 503, a portion of the first connection line 531 may be electrically connected to a portion of the second connection line 532. The third connection area 503 may be defined as a portion 403 where the first connection line 531 and the second connection line 532 cross each other.

According to an embodiment of the disclosure, as the first connection line 531 and the second connection line 532 are electrically connected in the third connection area 503, the electrical connection states of the ground sheet 440, the first ground line 4231, and the second ground line 4232 may remain good.

According to an embodiment of the disclosure, the first ground line 4231 may be electrically connected to the ground sheet 440 through a conductive path by the first connection line 531 or a conductive path by the second connection line 532 electrically connected to the first connection line 531.

According to an embodiment of the disclosure, the second ground line 4232 may be electrically connected to the ground sheet 440 through a conductive path by the second connection line 532 or a conductive path by the first connection line 531 electrically connected to the second connection line 532.

According to an embodiment of the disclosure, the ground sheet 440, the first ground line 4231, and/or the second ground line 4232 may provide an electromagnetic interference (EMI) shielding structure for the first signal line 421 and/or the second signal line 422.

According to an embodiment of the disclosure, as the ground sheet 440, the first ground line 4231, and/or the second ground line 4232 limits or reduces the occurrence of the impedance change of the first signal line 421 and/or the second signal line 422, the loss of power or electrical signal transferred through the second signal line 422 may be limited or reduced, and the power integrity (PI) and/or signal integrity (SI) of the second signal line 422 may be enhanced or improved.

According to an embodiment of the disclosure, the first connection line 531 and the second connection line 532 may cross each other in the third connection area 503. As the first connection line 531 and the second connection line 532 directly contact each other in the third connection area 503, the first connection line 531 may be electrically connected to the second connection line 532. According to an embodiment of the disclosure, in the third connection area 503, the first connection line 531 may contact the ground sheet 440, and the second connection line 532 may contact the second insulation layer 413. Although not illustrated, in the third connection area 503, the contact state between the first connection line 531 and the second connection line 532 may be provided so that the second connection line 532 contacts the ground sheet 440 and the first connection line 531 contacts the second insulation layer 413.

In the electronic device, a flexible connection member configured to electrically connect a plurality of circuit boards or to electrically connect one circuit board with at least one electrical/electronic component may be disposed. The flexible connection member may provide a conductive path of power and/or electrical signals transmitted between two components connected by the flexible connection member. Further, since the flexible connection member is configured to be at least partially folded or unfolded, the flexible connection member may connect two components in various shapes (or three-dimensional shapes) in a limited internal space of the electronic device.

With the advancement and/or integration of electronic devices, the flexible connection member is required to have a signal line capable of transmitting high-speed data. Compared to general signal lines, the signal line capable of high-speed data transmission may react sensitively to an impedance change, resulting in a loss of an electrical signal.

According to an embodiment of the disclosure, there may be provided a flexible connection member providing a shielding structure for signal lines and an electronic device including the flexible connection member.

The disclosure is not limited to the foregoing embodiments but various modifications or changes may rather be made thereto without departing from the spirit and scope of the disclosure.

According to an embodiment of the disclosure, there may be provided a flexible connection member that maintains a good electrical connection state between ground lines and a ground sheet to limit or reduce impedance changes in high-speed signal lines and an electronic device including the same.

According to an embodiment of the disclosure, there may be provided a flexible connection member providing an electromagnetic interference (EMI) shielding structure for signal lines and an electronic device including the same.

According to an embodiment of the disclosure, there may be provided a flexible connection member having enhanced or improved signal integrity (SI) of a high-speed signal line and an electronic device including the same.

Effects obtainable from the disclosure are not limited to the above-mentioned effects, and other effects not mentioned may be clearly understood by those skilled in the art from the following description.

According to an embodiment of the disclosure, the electronic device 101 may comprise a housing 301, a circuit board 341, at least one electrical component 343, or a flexible connection member 400. The circuit board 341 may be disposed inside the housing 301. The at least one electrical component 343 may be disposed inside the housing 301. The flexible connection member 400 may be electrically connected to the circuit board 341 and the at least one electrical component 343. The flexible connection member 400 may include an insulation layer 410, a signal line 421 or 422, a first ground line 4231, or a second ground line 4232. The signal line 421 or 422 may be disposed on the insulation layer 410. The first ground line 4231 may be disposed on the insulation layer 410. The second ground line 4232 may be disposed on the insulation layer 410. The second ground line 4232 may be spaced apart from the first ground line 4231. The ground sheet 440 may be disposed on the insulation layer 410. A first connection line **431*a* or 531 may be electrically connected to the first ground line 4231 and the ground sheet 440. The first connection line 431*a* or 531 may at least partially extend along a first direction. A second connection line 432*a* or 532 may be electrically connected to the second ground line 4232 and the ground sheet 440. The second ground line 4232 may at least partially extend along a second direction different from the first direction. The second ground line 4232 may cross the first connection line 431*a* or 531. At least a portion of the second connection line 432*a* or 532 may contact at least a portion of the first connection line 431*a* or 531**.

According to an embodiment of the disclosure, each of the first ground line 4231 and the second ground line 4232 may be electrically connected to a ground of the circuit board 341.

According to an embodiment of the disclosure, the first direction may be inclined with respect to a direction in which the first ground line 4231 extends. The second direction may be inclined with respect to a direction in which the second ground line 4232 extends.

According to an embodiment of the disclosure, a portion 403, or 503 where the first connection line 431*a* or 531 crosses the second connection line 432*a* or 532 may contact the ground sheet 440.

According to an embodiment of the disclosure, the insulation layer 410 may include a first insulation layer 411 or a second insulation layer 413. The second insulation layer 413 may be spaced apart from the first insulation layer 411. The first ground line 4231 and the second ground line 4232 may be disposed on the first insulation layer 411.

According to an embodiment of the disclosure, each of the first ground line 4231 and the second ground line 4232 may be disposed in a recess formed to be recessed in the first insulation layer 4231.

According to an embodiment of the disclosure, the ground sheet 440 may be stacked on the second insulation layer 413. Each of at least a portion of the first connection line 431*a* or 531 and at least a portion of the second connection line 432*a* or 532 may be disposed in a recess formed to be recessed in the second insulation layer 413.

According to an embodiment of the disclosure, the first connection line 431*a* may include a first connection portion 4311*a* or a first extension portion 4312*a*. The first connection portion 4311*a* may be disposed on the first ground line 4231. The first extension portion 4312*a* may extend from the first connection portion 4311*a*. The second connection line 432*a* may include a second connection portion 4321*a* or a second extension portion 4322*a*. The second connection portion 4321*a* may be disposed on the second ground line 4232. The second extension portion 4322*a* may extend from the second connection portion 4321*a*. At least a portion of the first extension portion 4312*a* may contact at least a portion of the second extension portion 4322*a*.

According to an embodiment of the disclosure, the first connection portion 4311*a* may be at least partially located between the first insulation layer 411 and the second insulation layer 413. The first extension portion 4312*a* may be at least partially located between the second insulation layer 413 and the ground sheet 440. The second connection portion 4321*a* may be at least partially located between the first insulation layer 411 and the second insulation layer 413. The second extension portion 4322*a* may be at least partially located between the second insulation layer 413 and the ground sheet 440.

According to an embodiment of the disclosure, the flexible connection member 400 may further include a third connection line 431*b* or a fourth connection line 432*b*. The third connection line 431*b* may be electrically connected to the first connection line 431*a* and the first ground line 4231. The fourth connection line 432*b* may be electrically connected to the second connection line 432*a* and the second ground line 4232.

According to an embodiment of the disclosure, the third connection line 431*b* may include a third connection portion 4311*b* or a third extension portion 4312*b*. The third connection portion 4311*b* may be disposed on the first ground line 4231. The third extension portion 4312*b* may extend from the third connection portion 4311*b*. The fourth connection line 432*b* may include a fourth connection portion 4321*b* or a fourth extension portion 4322*b*. The fourth connection portion 4321*b* may be disposed on the second ground line 4232. The fourth extension portion 4322*b* may extend from the fourth connection portion 4321*b*.

According to an embodiment of the disclosure, a direction in which the third extension portion 4312*b* extends may be different from a direction in which the first extension portion 4312*a* extends. A direction in which the fourth extension portion 4322*b* extends may be different from a direction in which the second extension portion 4322*a* extends.

According to an embodiment of the disclosure, at least a portion of the third connection line 431*b* may overlap the first connection line 431*a* and the first ground line 4231, with respect to a third direction from the first insulation layer 411 toward the second insulation layer 413. At least a portion of the fourth connection line 432*b* may overlap the second connection line 432*a* and the second ground line 4232 with respect to the third direction.

According to an embodiment of the disclosure, the signal line 421 or 422 may include a first signal line 421 or a second signal line 422. The second signal line 422 may be spaced apart from the first signal line 421. The second signal line 422 may be located between the first ground line 4231 and the second ground line 4232.

According to an embodiment of the disclosure, the flexible connection member 400 may include a flexible flat cable (FFC).

According to an embodiment of the disclosure, a flexible connection member 400 may include an insulation layer 410, a signal line 421 or 422, a first ground line 4231, or a second ground line 4232. The signal line 421 or 422 may be disposed on the insulation layer 410. The first ground line 4231 may be disposed on the insulation layer 410. The second ground line 4232 may be disposed on the insulation layer 410. The second ground line 4232 may be spaced apart from the first ground line 4231. The ground sheet 440 may be disposed on the insulation layer 410. A first connection line 431*a* or 531 may be electrically connected to the first ground line 4231 and the ground sheet 440. The first connection line 431*a* or 531 may at least partially extend along a first direction. A second connection line 432*a* or 532 may be electrically connected to the second ground line 4232 and the ground sheet 440. The second ground line 4232 may at least partially extend along a second direction different from the first direction. The second ground line 4232 may cross the first connection line 431*a* or 531. At least a portion of the second connection line 432*a* or 532 may contact at least a portion of the first connection line 431*a* or 531.

According to an embodiment of the disclosure, a portion 403 or 503 where the first connection line 431*a* or 531 crosses the second connection line 432*a* or 532 may contact the ground sheet 440.

According to an embodiment of the disclosure, the insulation layer 410 may include a first insulation layer 411 or a second insulation layer 413. The second insulation layer 413 may be spaced apart from the first insulation layer 411. The first ground line 4231 and the second ground line 4232 may be disposed on the first insulation layer 411.

According to an embodiment of the disclosure, the ground sheet 440 may be stacked on the second insulation layer 413. Each of at least a portion of the first connection line 431*a* or 531 and at least a portion of the second connection line 432*a* or 532 may be disposed in a recess formed to be recessed in the second insulation layer 413.

According to an embodiment of the disclosure, the first connection line 431*a* may include a first connection portion 4311*a* or a first extension portion 4312*a*. The first connection portion 4311*a* may be disposed on the first ground line 4231. The first extension portion 4312*a* may extend from the first connection portion 4311*a*. The second connection line 432*a* may include a second connection portion 4321*a* or a second extension portion 4322*a*. The second connection portion 4321*a* may be disposed on the second ground line 4232. The second extension portion 4322*a* may extend from the second connection portion 4321*a*. At least a portion of the first extension portion 4312*a* may contact at least a portion of the second extension portion 4322*a*.

It will be appreciated that various embodiments of the disclosure according to the claims and description in the specification can be realized in the form of hardware, software or a combination of hardware and software.

Any such software may be stored in non-transitory computer readable storage media. The non-transitory computer readable storage media store one or more computer programs (software modules), the one or more computer programs include computer-executable instructions that, when executed by one or more processors of an electronic device, cause the electronic device to perform a method of the disclosure.

Any such software may be stored in the form of volatile or non-volatile storage, such as, for example, a storage device like read only memory (ROM), whether erasable or rewritable or not, or in the form of memory, such as, for example, random access memory (RAM), memory chips, device or integrated circuits or on an optically or magnetically readable medium, such as, for example, a compact disk (CD), digital versatile disc (DVD), magnetic disk or magnetic tape or the like. It will be appreciated that the storage devices and storage media are various embodiments of non-transitory machine-readable storage that are suitable for storing a computer program or computer programs comprising instructions that, when executed, implement various embodiments of the disclosure. Accordingly, various embodiments provide a program comprising code for implementing apparatus or a method as claimed in any one of the claims of this specification and a non-transitory machine-readable storage storing such a program.

While the disclosure has been shown and described with reference to various embodiments thereof, it will be understood by those skilled in the art that various changes in form and detail may be made therein without departing from the spirit and scope of the disclosure as defined by the appended claims and their equivalents.

What is claimed is:

1. An electronic device comprising:

a housing;

a circuit board disposed inside the housing;

at least one electrical component disposed inside the housing; and a flexible connection member electrically connected to the circuit board and the at least one electrical component, wherein the flexible connection member includes:

an insulation layer, a signal line disposed on the insulation layer, a first ground line disposed on the insulation layer, a second ground line disposed on the insulation layer and spaced apart from the first ground line, a ground sheet disposed on the insulation layer, a first connection line electrically connected to the first ground line and the ground sheet and at least partially extending along a first direction, and a second connection line electrically connected to the second ground line and the ground sheet, at least partially extending along a second direction different from the first direction and crossing the first connection line, wherein the first connection line includes a first connection portion disposed on the first ground line and a first extension portion extending from the first connection portion, the first extension portion folded with respect to the first connection portion, wherein the second connection line includes a second connection portion disposed on the second ground line and a second extension portion extending from the second connection portion, the second extension portion folded with respect to the second connection portion, and wherein at least part of the first extension portion contacts at least part of the second extension portion.

2. The electronic device of claim 1, wherein each of the first ground line and the second ground line is electrically connected to a ground of the circuit board.

3. The electronic device of claim 1, wherein the first direction is inclined with respect to a direction in which the first ground line extends, and wherein the second direction is inclined with respect to a direction in which the second ground line extends.

4. The electronic device of claim 1, wherein a portion, where the first connection line and the second connection line cross each other, contacts the ground sheet.

5. The electronic device of claim 1, wherein the insulation layer includes a first insulation layer and a second insulation layer spaced apart from the first insulation layer, and wherein the first ground line and the second ground line are disposed on the first insulation layer.

6. The electronic device of claim 5, wherein each of the first ground line and the second ground line is disposed in a recess which is formed to be recessed in the first insulation layer.

7. The electronic device of claim 6, wherein the ground sheet is stacked on the second insulation layer, and wherein each of at least part of the first connection line and at least part of the second connection line is disposed in a recess which is formed to be recessed in the second insulation layer.

8. The electronic device of claim 6, wherein the first connection portion is at least partially located between the first insulation layer and the second insulation layer, wherein the first extension portion is at least partially located between the second insulation layer and the ground sheet, wherein the second connection portion is at least partially located between the first insulation layer and the second insulation layer, and wherein the second extension portion is at least partially located between the second insulation layer and the ground sheet.

9. The electronic device of claim 8, wherein the flexible connection member further includes:

a third connection line electrically connected to the first connection line and the first ground line; and a fourth connection line electrically connected to the second connection line and the second ground line.

10. The electronic device of claim 9, wherein the third connection line includes a third connection portion and a third extension portion extending from the third connection portion, and wherein the fourth connection line includes a fourth connection portion and a fourth extension portion extending from the fourth connection portion.

11. The electronic device of claim 10, wherein a direction, in which the third extension portion extends, is different from a direction in which the first extension portion, and wherein a direction, in which the fourth extension portion extends, is different from a direction in which the second extension portion.

12. The electronic device of claim 9, wherein at least a portion of the third connection line overlaps the first connection line and the first ground line with respect to a third direction from the first insulation layer toward the second insulation layer, and wherein at least a portion of the fourth connection line overlaps the second connection line and the second ground line with respect to the third direction.

13. The electronic device of claim 1, wherein the signal line includes:

a first signal line; and a second signal line spaced apart from the first signal line and located between the first ground line and the second ground line.

14. The electronic device of claim 1, wherein the flexible connection member includes a flexible flat cable (FFC).

15. A flexible connection member comprising:

an insulation layer;

a signal line disposed on the insulation layer;

a first ground line disposed on the insulation layer;

a second ground line disposed on the insulation layer and spaced apart from the first ground line;

a ground sheet disposed on the insulation layer;

a first connection line electrically connected to the first ground line and the ground sheet and at least partially extending along a first direction; and a second connection line electrically connected to the second ground line and the ground sheet, at least partially extending along a second direction different from the first direction, and crossing the first connection line, wherein the first connection line includes a first connection portion disposed on the first ground line and a first extension portion extending from the first connection portion, the first extension portion folded with respect to the first connection portion, wherein the second connection line includes a second connection portion disposed on the second ground line and a second extension portion extending from the second connection portion, the second extension portion folded with respect to the second connection portion, and wherein at least a portion of the first extension portion contacts at least a portion of the second extension portion.

16. The flexible connection member of claim 15, wherein a portion where the first connection line crosses the second connection line contacts the ground sheet.

17. The flexible connection member of claim 15, wherein the insulation layer includes a first insulation layer and a second insulation layer spaced apart from the first insulation layer, and wherein the first ground line and the second ground line are disposed on the first insulation layer.

18. The flexible connection member of claim 17, wherein the ground sheet is stacked on the second insulation layer, and wherein each of at least a portion of the first connection line and at least a portion of the second connection line is disposed in a recess formed to be recessed in the second insulation layer.

* * * * *